US012807476B2

(12) United States Patent
Rombach et al.

(10) Patent No.: US 12,807,476 B2
(45) Date of Patent: Nov. 24, 2026

(54) MICROELECTROMECHANICAL ACOUSTIC SENSOR WITH MEMBRANE ETCH RELEASE STRUCTURES AND METHOD OF FABRICATION

(71) Applicant: INVENSENSE, INC., San Jose, CA (US)

(72) Inventors: Pirmin Rombach, Kongens Lynby (DK); Kurt Rasmussen, Munich (DE); Dennis Mortensen, Munich (DE); Jan Ravnkilde, San Jose, CA (US); Cheng-Yen Liu, Kongens Lyngby (DK); Jotaro Akiyama, San Jose, CA (US); Sushil Bharatan, San Jose, CA (US); Troy Chase, Boston, MA (US)

(73) Assignee: INVENSENSE, INC., San Jose, CA (US)

( * ) Notice: Subject to any disclaimer, the term of this patent is extended or adjusted under 35 U.S.C. 154(b) by 244 days.

(21) Appl. No.: 18/490,312

(22) Filed: Oct. 19, 2023

(65) Prior Publication Data

US 2024/0133736 A1 Apr. 25, 2024
US 2024/0230400 A9 Jul. 11, 2024

Related U.S. Application Data

(60) Provisional application No. 63/380,274, filed on Oct. 20, 2022.

(51) Int. Cl.
*B81B 3/00* (2006.01)
*B81C 1/00* (2006.01)
(Continued)

(52) U.S. Cl.
CPC ........ *B81B 3/0051* (2013.01); *B81C 1/00158* (2013.01); *H04R 7/10* (2013.01);
(Continued)

(58) Field of Classification Search
CPC .............. B81B 3/0051; B81C 1/00158; B81C 2201/056; H04R 7/10; H04R 7/12;
(Continued)

(56) References Cited

U.S. PATENT DOCUMENTS 9,078,069 B2 7/2015 Bharatan et al.
9,462,389 B2 10/2016 Wang
(Continued)

FOREIGN PATENT DOCUMENTS

CN 102822084 A 12/2012
CN 105721997 A 6/2016
(Continued)

OTHER PUBLICATIONS

Non-Final Office Action received for U.S. Appl. No. 17/308,340, dated Dec. 30, 2022, 18 pages.
(Continued)

*Primary Examiner* — Ryan D Walsh
(74) *Attorney, Agent, or Firm* — Amin, Turocy & Watson, LLP

(57) ABSTRACT

Low-cost, robust, and high performance microelectromechanical systems (MEMS) acoustic sensors are described. Described MEMS acoustic sensors can comprise a set of etch release structures in the acoustic sensor membrane that facilitates rapid and/or uniform etch release of the acoustic sensor membrane. In addition, MEMS acoustic sensors can comprise a set of membrane position control structures of the acoustic sensor membrane that can reduce the bending stress of the acoustic sensor membrane. MEMS acoustic sensors can further comprise a three layer acoustic sensor membrane that provides increased robustness. Further design flexibility and improvements are described that provide increased robustness and/or cost savings, and a low cost fabrication process for MEMS acoustic sensors is provided.

19 Claims, 32 Drawing Sheets

(51) Int. Cl.

| | |
|---|---|
| ***H04R 7/10*** | (2006.01) |
| ***H04R 7/12*** | (2006.01) |
| ***H04R 19/00*** | (2006.01) |
| ***H04R 19/04*** | (2006.01) |
| ***H04R 31/00*** | (2006.01) |

(52) U.S. Cl.

CPC ............. *H04R 7/12* (2013.01); *H04R 19/005* (2013.01); *H04R 19/04* (2013.01); *H04R 31/003* (2013.01); *B81C 2201/056* (2013.01); *H04R 2201/003* (2013.01); *H04R 2307/023* (2013.01)

(58) Field of Classification Search

CPC .... H04R 19/005; H04R 19/04; H04R 31/003; H04R 2201/003; H04R 2307/023

See application file for complete search history.

(56) References Cited

U.S. PATENT DOCUMENTS

| | | | | |
|---|---|---|---|---|
| 10,250,998 | B2 | 4/2019 | Hsieh et al. | |
| 10,327,077 | B2 | 6/2019 | Yoo | |
| 10,623,866 | B2 * | 4/2020 | Cerini | H10N 30/302 |
| 11,388,496 | B2 | 7/2022 | Rombach et al. | |
| 11,746,001 | B2 | 9/2023 | Rombach | |
| 2008/0175417 | A1 | 7/2008 | Kok et al. | |
| 2008/0212409 | A1 | 9/2008 | Lutz | |
| 2009/0169035 | A1 | 7/2009 | Rombach et al. | |
| 2010/0065930 | A1 | 3/2010 | Nakatani | |
| 2010/0284553 | A1 * | 11/2010 | Conti | H04R 19/04 381/174 |
| 2011/0278683 | A1 | 11/2011 | Kasai et al. | |
| 2015/0041930 | A1 | 2/2015 | Kim et al. | |
| 2015/0041960 | A1 | 2/2015 | Morii et al. | |
| 2015/0358735 | A1 | 12/2015 | Klein et al. | |
| 2018/0077499 | A1 | 3/2018 | Yoo | |
| 2018/0115836 | A1 | 4/2018 | Hsieh et al. | |
| 2018/0208455 | A1 | 7/2018 | Wang | |
| 2018/0222749 | A1 | 8/2018 | Dehe | |
| 2018/0362332 | A1 * | 12/2018 | Khenkin | B81B 7/0058 |
| 2019/0082270 | A1 | 3/2019 | Sun | |
| 2019/0092624 | A1 | 3/2019 | Walther et al. | |
| 2019/0124452 | A1 | 4/2019 | Hsieh et al. | |
| 2019/0127217 | A1 | 5/2019 | Cargill et al. | |
| 2019/0394573 | A1 | 12/2019 | Cheng et al. | |
| 2020/0196065 | A1 | 6/2020 | Pedersen et al. | |
| 2020/0290864 | A1 | 9/2020 | Fueldner et al. | |
| 2021/0067882 | A1 | 3/2021 | Rombach | |
| 2022/0070568 | A1 | 3/2022 | Tang et al. | |
| 2023/0118429 | A1 | 4/2023 | Rombach et al. | |
| 2023/0356998 | A1 | 11/2023 | Rombach et al. | |
| 2024/0089668 | A1 * | 3/2024 | Seeger | B81B 3/0072 |

FOREIGN PATENT DOCUMENTS

| | | | |
|---|---|---|---|
| CN | 108367908 | A | 8/2018 |
| CN | 110113699 | A | 8/2019 |
| CN | 110392331 | A | 10/2019 |
| CN | 111147992 | A | 5/2020 |
| CN | 111935620 | | 11/2020 |
| EP | 2252077 | | 11/2010 |
| TW | 201736246 | A | 10/2017 |
| TW | 202214516 | A | 4/2022 |
| WO | 2014/159552 | A1 | 10/2014 |
| WO | 2021226268 | | 11/2021 |

OTHER PUBLICATIONS

Notice of Allowance received for U.S. Appl. No. 17/308,340, dated Apr. 26, 2023, 19 pages.

Invitation to Pay Additional Fees received for International Application No. PCT/US2022/043704 dated Jun. 1, 2023, 14 pages.

International Search Report and Written Opinion received for International Application No. PCT/US2022/043704 dated Jul. 24, 2023, 20 pages.

International Search Report and Written Opinion received for International Application No. PCT/US2021/030938 dated Jul. 26, 2021, 17 pages.

Notification Concerning Transmittal of International Preliminary Report on Patentability for PCT Application No. PCT/US2022/043704, mailed Mar. 27, 2025, 13 pages.

Notification Concerning Transmittal of International Preliminary Report on Patentability for PCT Application No. PCT/US2023/035597, mailed May 1, 2025, 10 pages.

European Office Action mailed Apr. 24, 2025 for European Patent Application No. 22786632.4, 3 pages.

European Office Action mailed May 27, 2025 for European Patent Application No. 23806414.1, 3 pages.

Non-Final Office Action received for U.S. Appl. No. 17/931,783, dated May 22, 2024, 46 pages.

Notice of Allowance received for U.S. Appl. No. 17/931,783, dated Aug. 14, 2024, 27 pages.

Notice of Allowance mailed Feb. 22, 2024 for U.S. Appl. No. 18/357,784, 28 pages.

International Search Report and Written Opinion for International Application No. PCT/US2023/035597 dated Jan. 30, 2024.

Chinese Office Action for CN Application No. 202280100039.3, mailed Jun. 19, 2025, 13 pages (with translation).

Chinese Office Action for CN Application No. 202280100039.3, mailed Nov. 21, 2025, 10 pages (with translation).

Chinese Office Action for CN Application No. 202180040564.6, mailed Feb. 12, 2026, 17 pages (with translation).

Wang Chengxiang et al. "Latest Advance in Fabrication Technologies of MEMS-Type Capacitance Diaphragm Gauge" Chinese Journal of Vacuum Science and Technology, vol. 39, Issue 01, Jan. 15, 2019, 10 pages.

Chinese Office Action mailed May 15, 2026 for CN Application No. 202280100039.3, 4 pages.

Taiwan Office Action for TW Application No. 112140252 mailed Mar. 27, 2026, 20 pages.

Chinese Notification of Allowance mailed Jul. 27, 2026 for CN Application No. 202280100039.3, 4 pages.

* cited by examiner

MICROELECTROMECHANICAL ACOUSTIC SENSOR WITH MEMBRANE ETCH RELEASE STRUCTURES AND METHOD OF FABRICATION

CROSS REFERENCE TO RELATED APPLICATIONS

This application claims the benefit of and priority to U.S. Provisional Application No. 63/380,274, filed Oct. 20, 2022, entitled “MICROPHONE PROCESS,” the content of which application is hereby expressly incorporated by reference herein in its entirety.

BACKGROUND

Microelectromechanical systems (MEMS) is a class of structures and/or devices that are fabricated using semiconductor-like processes. MEMS structures and/or devices exhibit mechanical characteristics that include the ability to move or to deform. Examples of MEMS devices include, but are not limited to, gyroscopes, accelerometers, magnetometers, pressure sensors, radio-frequency components, and so on. Silicon wafers that include MEMS structures are referred to as MEMS wafers. Unique challenges exist to provide MEMS devices and/or structures with improved performance and reliability.

For example, robustness requirements may dictate that fabricated devices such as MEMS acoustic sensors survive extreme environmental conditions such as a drop test. Concurrently, performance requirements (e.g., high sensitivity and high active capacitance) can requiring high membrane compliance and low parasitic capacitance at the MEMS read-out node are further electro-acoustic design criteria. In addition, size and/or cost considerations (e.g., low MEMS process cost) can contradict these other design considerations.

It is thus desired to provide improved MEMS acoustic sensor designs and processes that address these and other deficiencies. The above-described deficiencies are merely intended to provide an overview of some of the problems of conventional implementations, and are not intended to be exhaustive. Other problems with conventional implementations and techniques and corresponding benefits of the various aspects described herein may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, low-cost, robust, and high performance microelectromechanical systems (MEMS) acoustic sensors are described. In a non-limiting aspect, exemplary MEMS acoustic sensors can comprise a set of etch release structures in the acoustic sensor membrane that facilitates rapid and/or uniform etch release of the acoustic sensor membrane. In another non-limiting aspect, exemplary MEMS acoustic sensors can comprise a set of membrane position control structures of the acoustic sensor membrane that can reduce the bending stress of the acoustic sensor membrane. In another non-limiting aspect, MEMS acoustic sensors can comprise a three layer acoustic sensor membrane that provides increased robustness.

In addition, further flexibility and improvements are described that provide increased robustness and/or cost savings. Moreover, a low cost fabrication process for the described exemplary MEMS acoustic sensors is provided.

These and other embodiments are described in more detail below.

BRIEF DESCRIPTION OF THE DRAWINGS

Various non-limiting embodiments are further described with reference to the accompanying drawings in which.

DETAILED DESCRIPTION

Overview

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As described above, robustness requirements for MEMS devices may dictate that fabricated devices such as MEMS acoustic sensors survive extreme environmental conditions such as a drop test (e.g., high pressure impact test with pressures between 0.1 megapascal (MPa)-0.8 MPa). Concurrently, performance requirements (e.g., high sensitivity and high active capacitance) requiring high membrane compliance and low parasitic capacitance at the MEMS read-out node are further electro-acoustic design criteria. In addition, size and/or cost considerations (e.g., low MEMS process cost roughly determined by lithographic mask count) can contradict these other design considerations. Various embodiments described herein can provide a small, low-cost MEMS acoustic sensor process resulting in a device with high robustness, superior electro-acoustic performance (e.g., high sensitivity and high active capacitance), high membrane compliance, and low parasitic capacitance at the MEMS read-out node.

To these and/or related ends, various aspects of MEMS acoustic sensors, devices, systems, and methods therefor are described. Various embodiments of the subject disclosure are described herein for purposes of illustration, and not limitation. For example, embodiments of the subject disclosure are described herein in the context of a MEMS sensor, such as a MEMS acoustic sensor. However, it can be appreciated that various aspects of the subject disclosure is not so limited. As further detailed below, various exemplary implementations may find application in other areas of MEMS sensor design and/or packaging, without departing from the subject matter described herein.

Exemplary Embodiments

One or more embodiments are now described more fully hereinafter with reference to the accompanying drawings in which example embodiments are shown. In the following description, for purposes of explanation, numerous specific details are set forth in order to provide a thorough understanding of the various embodiments.

Figure 1:
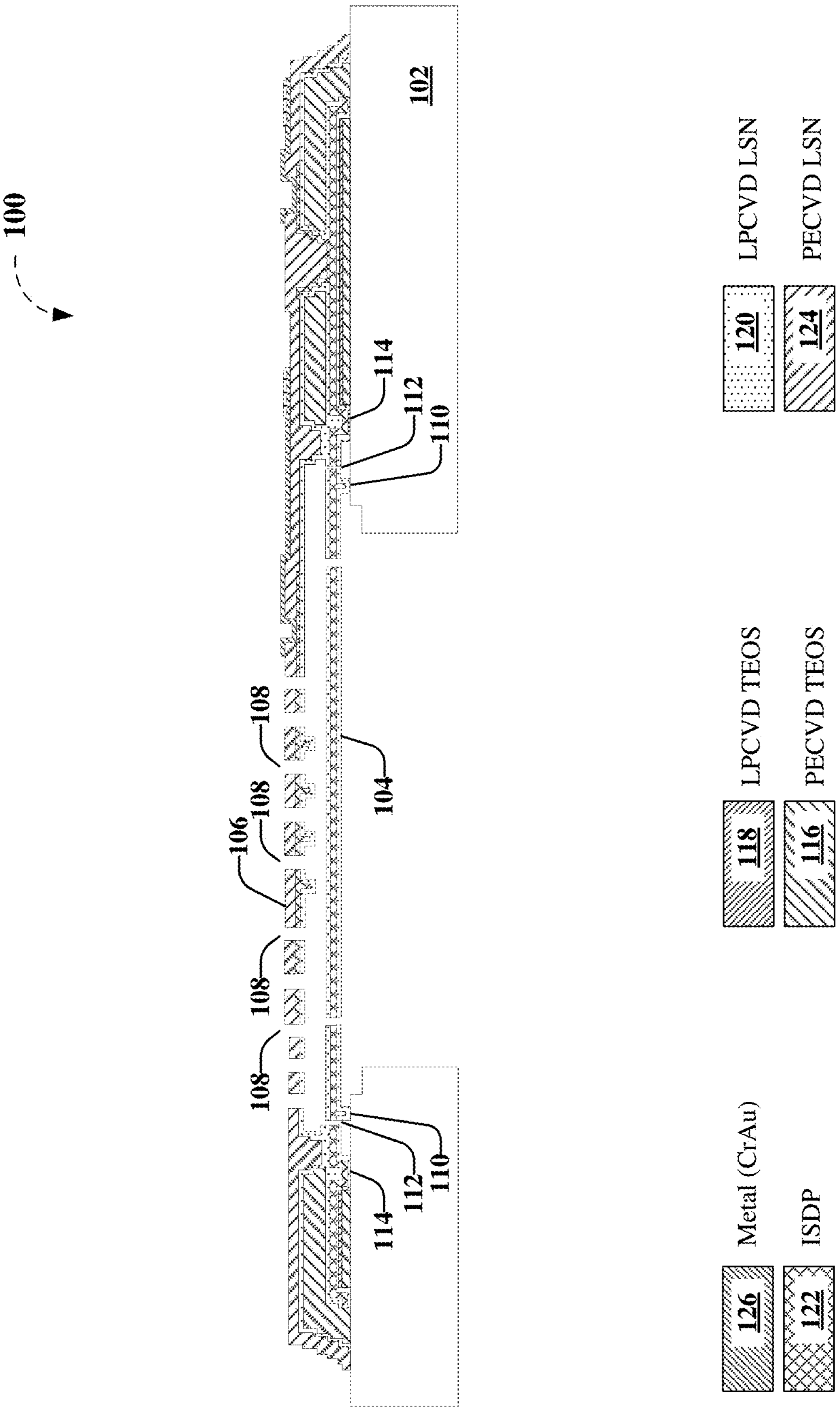
FIG. 1 provides a cross-section of exemplary microelectromechanical systems (MEMS) acoustic sensors that depict various non-limiting aspects of exemplary MEMS acoustic sensors described herein.

FIG. 1 provides a cross-section of exemplary MEMS acoustic sensors 100 that depict various non-limiting aspects of exemplary MEMS acoustic sensors 100 described herein. Exemplary MEMS acoustic sensors 100 can comprise a device substrate 102 (e.g., a wafer substrate). In a non-limiting aspect, the device substrate 102 can comprise a silicon wafer, for example. In addition, exemplary MEMS acoustic sensors 100 can comprise an acoustic sensor membrane 104. For instance, exemplary MEMS acoustic sensors 100 can comprise an acoustic sensor membrane 104 that can be suspended above and mechanically coupled to device substrate 102 at a periphery of the acoustic sensor membrane 104, wherein the acoustic sensor membrane 104 is configured to be deformed by acoustic pressure (e.g., acoustic pressure applied via a device package port) according to non-limiting aspects. As used herein, the term, "periphery," is used to refer to an outer edge of a shape, whatever shape is employed. For instance, various non-limiting embodiments described herein can employ any configuration of conceivable shapes of a suitable acoustic sensor membrane 104, as further described herein regarding FIGS. 4-5.

In further non-limiting embodiments, exemplary MEMS acoustic sensors 100 can further comprise an acoustic sensor backplate or top plate 106. In a non-limiting aspect, exemplary acoustic sensor backplate or top plate 106 can be mechanically coupled to the acoustic sensor membrane 104. In further non-limiting aspects, exemplary acoustic sensor backplate or top plate 106 can comprise openings 108 that permit passage of the acoustic pressure.

In further non-limiting embodiments, exemplary MEMS acoustic sensors 100 can further comprise a set of membrane position control structures 110 of the acoustic sensor membrane 104. As a non-limiting example, a set of exemplary membrane position control structures 110 can be positioned on the acoustic sensor membrane 104 near the periphery of the acoustic sensor membrane 102. In further non-limiting aspects, a set of exemplary membrane position control structures 110 can extend perpendicular relative to a surface of the acoustic sensor membrane 104 opposite the acoustic sensor backplate or top plate 106. It can be understood that the exemplary membrane position control structures 110 are shown in a cross-section, which limits the depiction of the characteristics of the exemplary membrane position control structures 110. As further described herein, the number, position (e.g., pitch and distance), configuration (shape and/or construction), and arrangement (relative to other components) of the exemplary membrane position control structures 110 can vary, without limitation.

In still further non-limiting embodiments, exemplary MEMS acoustic sensors 100 can further comprise a set of etch release structures 112 in the acoustic sensor membrane 104. In a non-limiting aspect, a set of exemplary etch release structures 112 can be located between the periphery of the acoustic sensor membrane 104 and the set of exemplary membrane position control structures 110. In further non-limiting aspects of exemplary MEMS acoustic sensor 100, the set of etch release structures 112 can be configured to enable a uniform wet etch in an area of the acoustic sensor membrane 104, the lateral etch stop structure 114, and the set of membrane position control structures 110 during an acoustic sensor membrane 104 etch release fabrication process. As a non-limiting example, the set of etch release structures 112 in the acoustic sensor membrane 104 can comprise a set of passages through the acoustic sensor membrane 104 that are configured to allow the wet etch into the area. In further non-limiting aspects of exemplary MEMS acoustic sensor 100, the set of passages through the acoustic sensor membrane 104 can be configured to reduce etch time required to equalize an etch in the area. In still further non-limiting aspects of exemplary MEMS acoustic sensor 100, the number, position, and arrangement of the set of passages of the set of etch release structures 112 in the acoustic sensor membrane 104 can vary, without limitation, as further described herein.

In yet other non-limiting embodiments, exemplary MEMS acoustic sensors 100 can further comprise a lateral etch stop structure 114 disposed on the acoustic sensor membrane 104. In a non-limiting aspect, an exemplary lateral etch stop structure 114 can be located at the periphery of the acoustic sensor membrane 104, where the acoustic sensor membrane 104 is mechanically coupled to the device substrate 102. As with the depiction of the exemplary membrane position control structures 110, it can be understood that the exemplary lateral etch stop structure 114 is shown in a cross-section, which limits the depiction of the characteristics of the exemplary lateral etch stop structure 114. Thus, exemplary lateral etch stop structure 114 can be expected to conform to the selected shape employed as the exemplary acoustic sensor membrane 104.

Figure 2:
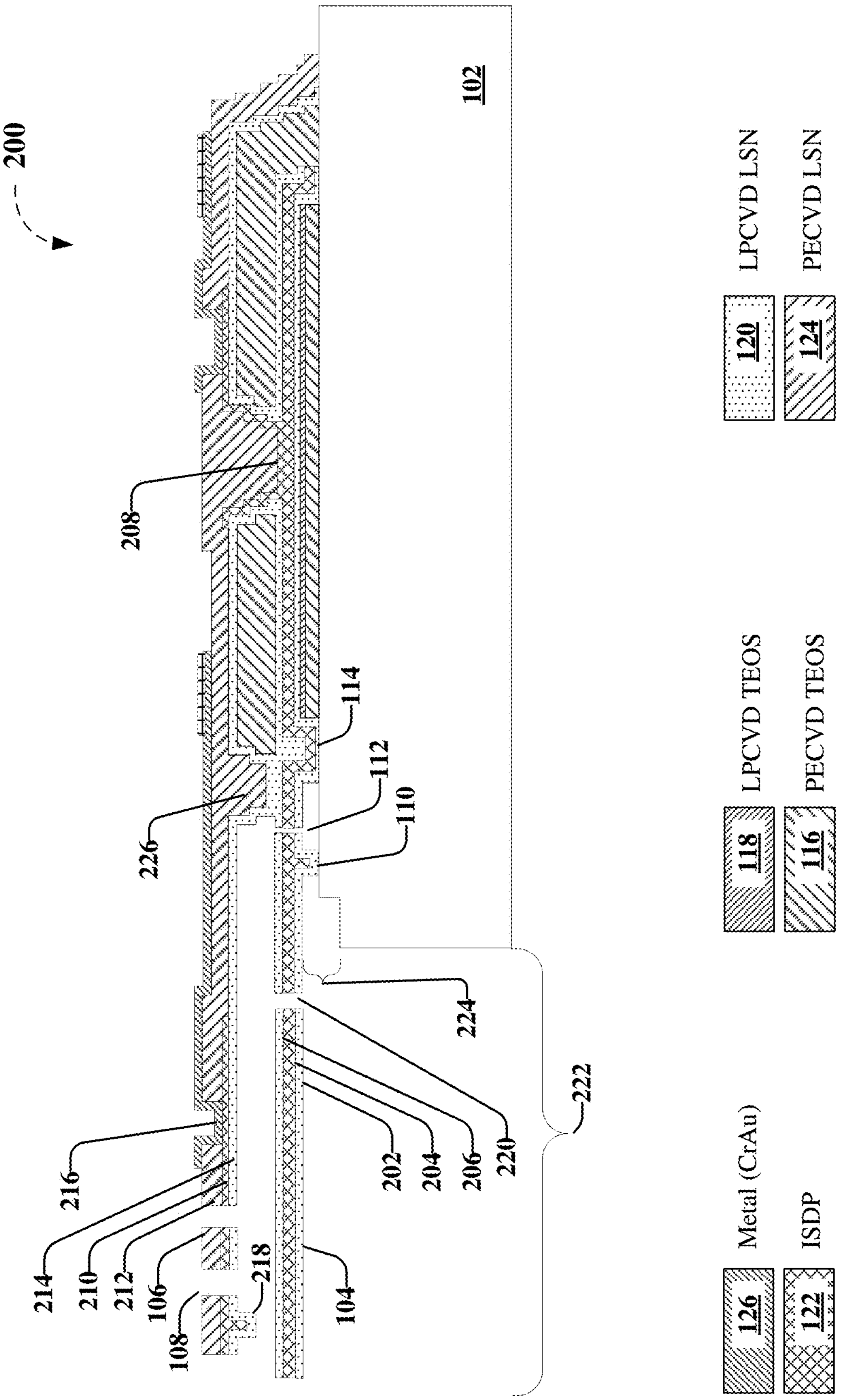
FIG. 2 provides another cross-section of exemplary MEMS acoustic sensors that depict further non-limiting aspects of exemplary MEMS acoustic sensors described herein.

In further non-limiting aspects of exemplary MEMS acoustic sensor 100, the set of membrane position control structures 110 can be configured to limit movement of the acoustic sensor membrane 104 in a direction away from the acoustic sensor backplate or top plate 106. In another non-limiting aspect of exemplary MEMS acoustic sensor 100, the set of membrane position control structures 110 can be configured to reduce bending stress on the acoustic sensor membrane 104 at a junction of the acoustic sensor membrane 104 and the lateral etch stop structure 114, for example, as further described herein regarding FIGS. 6-7. As a non-limiting example, the set of membrane position control structures 110 of exemplary MEMS acoustic sensor 100 can comprise a number of separate membrane position control structures 110, each protruding perpendicular relative to a surface of the acoustic sensor membrane 104, opposite the acoustic sensor backplate or top plate 106, and toward the device substrate 102, as depicted in FIGS. 1-2 and as further described below regarding FIGS. 3 and 5-7. As a further non-limiting example, an exemplary set of membrane position control structures 110 of exemplary MEMS acoustic sensor 100 can be arranged in a singular sequence of membrane position control structures near the periphery of the acoustic sensor membrane 104, multiple sequences of membrane position control structures near the periphery of the acoustic sensor membrane 104, and/or other arrangements, configurations and/or numbers which can be configured to limit movement of the acoustic sensor membrane 104 in a direction away from the acoustic sensor backplate or top plate 106 or reduce bending stress on the acoustic sensor membrane 104 at a junction of the acoustic sensor membrane 104 and the lateral etch stop structure 114, as further described below regarding FIGS. 3 and 5-7.

The following abbreviations are used throughout the disclosure to describe various semiconductor-like processes and materials used in exemplary MEMS fabrication processes. It can be understood that there may be suitable substitutions or alternative materials and/or processes to accomplish the described techniques, devices, processes, and so on. As such, descriptions herein of the various semiconductor-like processes and materials used in exemplary MEMS fabrication processes is intended to provide understanding of the appended claims without limitation. For example, as used herein, PECVD TEOS 116 refers to an exemplary MEMS fabrication process comprising one or more plasma-enhanced chemical vapor deposition processes (PECVD) employing tetraethylorthosilicate (TEOS) and the resultant layers/structures that are derived from such processes including any lithographic patterning and/or etch processes, as further described herein regarding FIGS. 8-31.

LPCVD TEOS 118 refers to an exemplary MEMS fabrication process comprising one or more low pressure chemical vapor deposition processes (LPCVD) using tetraethyl orthosilicate (TEOS) and the resultant layers/structures that are derived from such processes including any lithographic patterning and/or etch processes. In addition, LPCVD LSN 120 refers to an exemplary MEMS fabrication process comprising one or more LPCVD Low Stress Silicon Nitride (LSN) deposition processes and the resultant layers/structures that are derived from such processes including any lithographic patterning and/or etch processes.

ISDP 122 refers to an exemplary MEMS fabrication process comprising one or more in-situ phosphorous doped polycrystalline silicon deposition processes and the resultant layers/structures that are derived from such processes including any lithographic patterning and/or etch processes. PECVD LSN 124 refers to an exemplary MEMS fabrication process comprising one or more PECVD Low Stress Silicon Nitride (LSN) deposition processes and the resultant layers/structures that are derived from such processes including any lithographic patterning and/or etch processes, as further described herein regarding FIGS. 8-32. Metal (CrAu) 126 refers to an exemplary MEMS fabrication process comprising one or more metal deposition processes employing a gold metal alloy and the resultant layers/structures that are derived from such processes including any lithographic patterning and/or etch processes.

FIG. 2 provides another cross-section of exemplary MEMS acoustic sensors that depict further non-limiting aspects of exemplary MEMS acoustic sensors described herein. As depicted in FIG. 2, further non-limiting embodiments of exemplary MEMS acoustic sensors 100 can comprise exemplary acoustic sensor membrane 104 that comprises a stacked arrangement of a first silicon nitride (SiN) acoustic sensor membrane 104 layer 202, a polycrystalline silicon (poly-Si) acoustic sensor membrane 104 electrode layer 204, and a second SiN acoustic sensor membrane 104 layer 206. Further non-limiting embodiments of exemplary MEMS acoustic sensors 100 can comprise a poly-Si contact 208 coupled to the poly-Si acoustic sensor membrane 104 electrode layer 204.

In addition, further non-limiting embodiments of exemplary MEMS acoustic sensors 100 can comprise an exemplary acoustic sensor backplate or top plate 106 comprising a poly-Si backplate or top plate 106 electrode layer 210 adjacent to a second SiN backplate or top plate 106 layer 212 and a first SiN backplate or top plate 106 layer 214 that is adjacent to the poly-Si backplate or top plate 106 electrode layer 210 and opposite the second SiN backplate or top plate 106 layer 212. In further non-limiting embodiments, exemplary MEMS acoustic sensor 100 can further comprise a metal contact 216 coupled to the poly-Si backplate or top plate 106 electrode layer 210. In still further non-limiting embodiments, exemplary acoustic sensor backplate or top plate 106 can be configured with one or more backplate or top plate 106 stops 218. As FIG. 2 is an expanded cross-section of exemplary MEMS acoustic sensors 100, only one of the one or more exemplary backplate or top plate 106 stops 218 is depicted in FIG. 2, whereas FIG. 1 depicts a number of such exemplary structures. In a further non-limiting aspect, exemplary one or more backplate or top plate 106 stops 218 can be comprised of the first SiN backplate or top plate 106 layer 214. In another non-limiting aspect, exemplary one or more backplate or top plate 106 stops 218 can be adapted to limit contact of the acoustic sensor membrane 104 with the acoustic sensor backplate or top plate 106.

Figure 4:
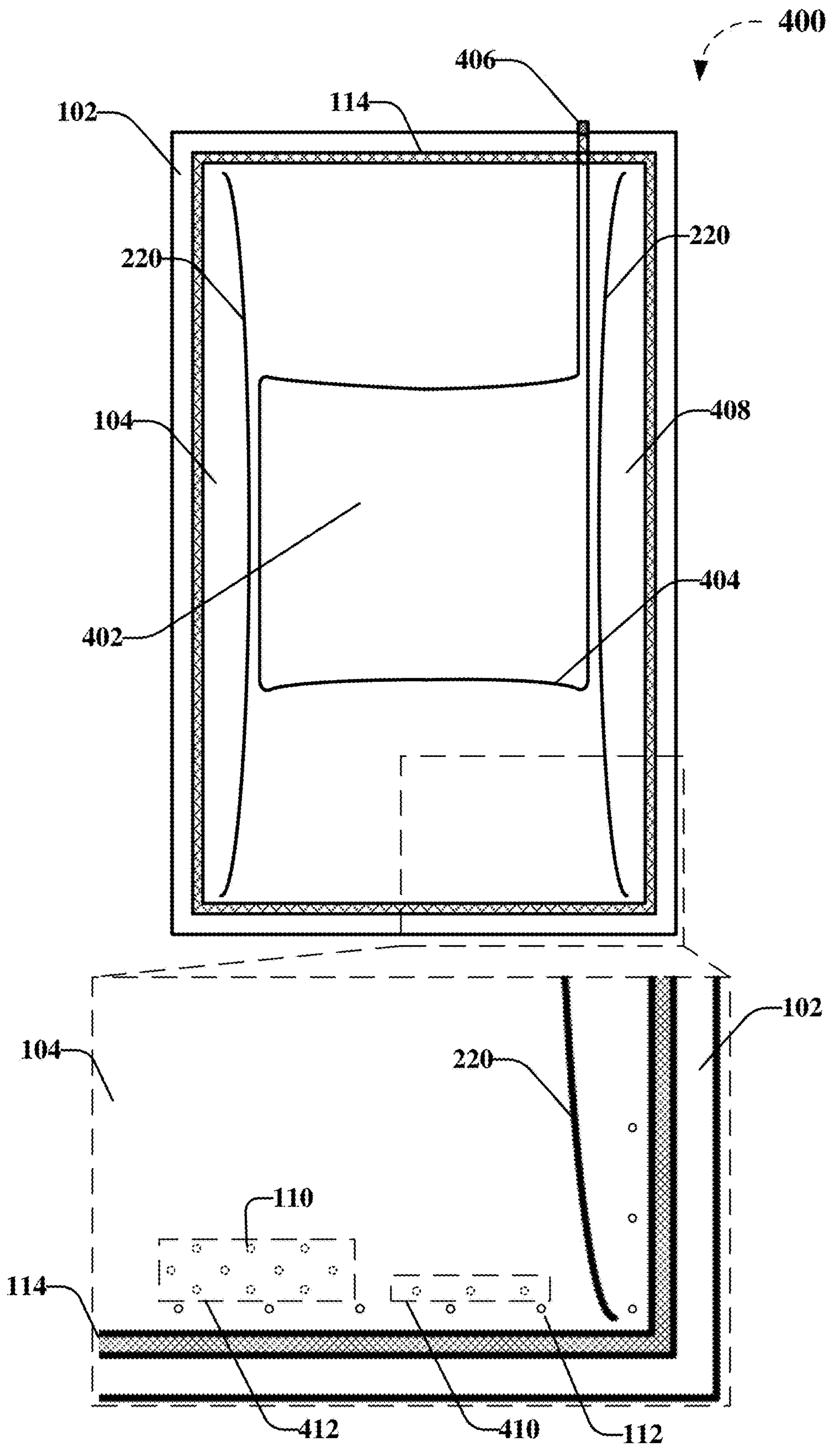
FIG. 4 depicts non-limiting aspects of an exemplary acoustic sensor membrane suitable for use in exemplary MEMS acoustic sensors described herein.

In other non-limiting embodiments of exemplary MEMS acoustic sensor 100, exemplary acoustic sensor membrane 104 can further comprise one or more vents 220 formed into the acoustic sensor membrane 104, for example, as further described herein regarding FIG. 4. In a non-limiting aspect, a portion of the one or more exemplary vents 220 can comprise a curved opening in the acoustic sensor membrane 104. In a further non-limiting aspect, the one or more exemplary vents 220 can be disposed substantially along a side of the acoustic sensor membrane 104, for example, as further described herein regarding FIG. 4. As FIG. 2 is an expanded cross-section of exemplary MEMS acoustic sensors 100, only one of the one or more exemplary vents 220 is depicted in FIG. 2, whereas FIG. 1 depicts a number of such exemplary structures, for example, as further described regarding FIG. 4.

In still further non-limiting embodiments, exemplary MEMS acoustic sensors 100 can further comprise an acoustic port 222 formed in the device substrate 102 that is configured to direct the acoustic pressure to the acoustic sensor membrane 104 to deflect the acoustic sensor membrane 104 toward the acoustic sensor backplate or top plate 106. In other non-limiting embodiments, exemplary MEMS acoustic sensors 100 can further comprise a front cavity 224 formed in the port 222, proximate to the acoustic sensor membrane 104, and configured to prevent contact of the acoustic sensor membrane 104 with the device substrate 102. In a non-limiting aspect, exemplary front cavity 224 can be omitted from the fabrication process and resulting devices based on the employment of a number or array (e.g., multiple sequences) of membrane position control structures 110, for example, as further describe herein regarding FIG. 3.

Figure 3:
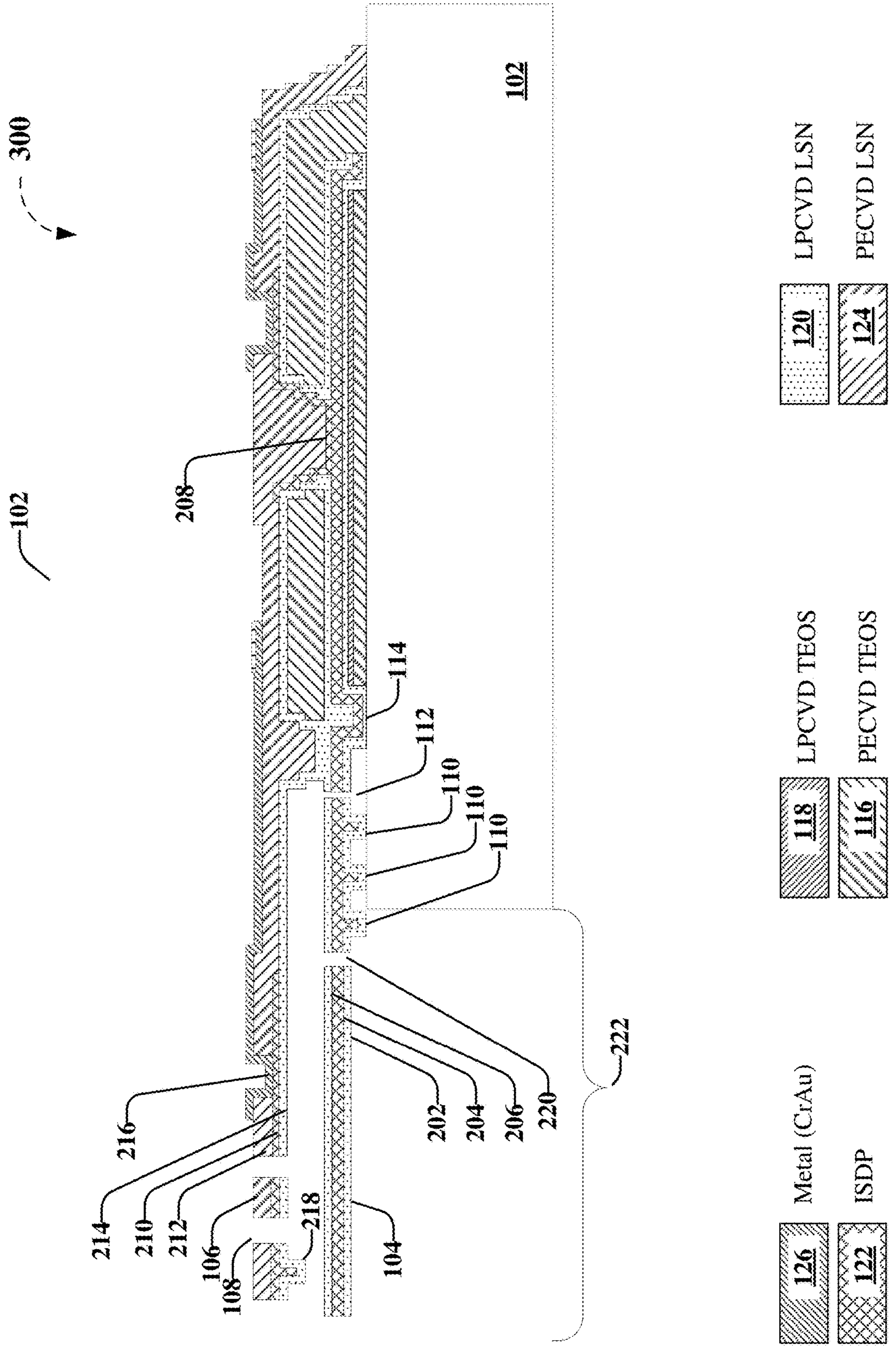
FIG. 3 provides another cross-section of exemplary MEMS acoustic sensors that depict further non-limiting aspects of exemplary MEMS acoustic sensors described herein.

For instance, FIG. 3 provides another cross-section 300 of exemplary MEMS acoustic sensors 100 that depict further non-limiting aspects of exemplary MEMS acoustic sensors described herein. Thus, as described above, in a non-limiting aspect, exemplary front cavity 224 in acoustic port 222 can be omitted from the fabrication process and resulting devices based on the employment of a number or array (e.g., multiple sequences) of membrane position control structures 110. That is, by omission of exemplary front cavity 224 in acoustic port 222 from the fabrication process and resulting devices, for example, as further described herein regarding FIG. 3. In still further non-limiting embodiments, exemplary MEMS acoustic sensor 100 can further comprise an exemplary backplate or top plate 106 lateral etch stop structure 226. In a non-limiting aspect, the exemplary backplate or top plate 106 lateral etch stop structure 226 can define the physical extent of the exemplary backplate or top plate 106. In other non-limiting aspects, exemplary backplate or top plate 106 lateral etch stop structure 226 can be disposed on the acoustic sensor backplate (e.g., exemplary backplate or top plate 106), and can be located where the acoustic sensor backplate (e.g., exemplary backplate or top plate 106) is mechanically coupled to the acoustic sensor membrane (e.g., exemplary acoustic sensor membrane 104).

FIG. 4 depicts non-limiting aspects of an exemplary acoustic sensor membrane 104 suitable for use in exemplary MEMS acoustic sensors 100 described herein. FIG. 4 depicts an exemplary fixed-fixed acoustic sensor membrane 104 that can be employed in exemplary MEMS acoustic sensors 100. As shown in FIG. 4, the acoustic sensor membrane 104 can be mechanically coupled to an underlying device substrate 102 and/or another suitable device surface. Techniques by which the acoustic sensor membrane 104 can be attached to the device substrate 102 are described in further detail below.

As further shown in FIG. 4, the acoustic sensor membrane 104 can have a substantially rectangular shape, i.e., such that a perimeter of the acoustic sensor membrane 104 has two longer sides and two shorter sides. As described above, the term, “periphery,” is used to refer to an outer edge of a shape, whatever shape is employed. Thus, for the rectangular shape of acoustic sensor membrane 104 of FIG. 4, the periphery may be generally rectangular. In other non-limiting embodiments, acoustic sensor membrane 104 can employ any configuration of conceivable shapes of a suitable acoustic sensor membrane 104, as further described herein regarding FIG. 5, with the resultant periphery conforming to the selected shape.

Other shapes could also be utilized for the acoustic sensor membrane 104, some examples of which are described in further detail below with respect to FIG. 5. Exemplary acoustic sensor membrane 104 can be composed of one or more layers, e.g., as described herein, each of which can be solid and/or have respective holes or other openings (e.g., one or more exemplary vents 220, a set of etch release structures 112) to improve airflow through the acoustic sensor membrane 104, to provide for uniform and/or rapid etch, and/or for other purposes. The acoustic sensor membrane 104 shown in FIG. 4 can conceptually be divided into three membrane portions. A first portion of the acoustic sensor membrane 104, also referred to herein as a sensing area or an electrode 402 of the acoustic sensor membrane 104 electrode layer 204, can be configured to sense deflection of the acoustic sensor membrane 104 in response to deflection under applied acoustic pressure.

As further shown in FIG. 4, the perimeter of the sensing area or an electrode 402 is defined by an electrode trench 404 that is embedded into the acoustic sensor membrane 104. The electrode trench 404 can additionally be terminated at an electrical contact 406 coupled with poly-Si contact 208. In an embodiment, the electrode 402 can be placed as shown in FIG. 4, i.e., substantially in the center of the acoustic sensor membrane 104. This can be done, e.g., in order to maximize the distance between the electrode 402 and the edges of the acoustic sensor membrane 104, which can in turn result in improved acoustic sensitivity due to higher capacitive variance associated with displacement of the acoustic sensor membrane 104 at the area of the electrode 402. As further shown in FIG. 4, the electrode 402 can exhibit curvature on one or more sides relative to the edges of the acoustic sensor membrane 104, e.g., to follow the displacement contours of the acoustic sensor membrane 104 resulting from one or more vents 220 formed into the membrane as will be described below. With respect to the example shown by diagram 400, it is noted that the electrode 402 shown in FIG. 4 is for illustrative purposes only and that other electrode shapes and/or sizes could also be implemented.

As further shown in FIG. 4, a second portion of the acoustic sensor membrane 104 can further comprise a lateral etch stop structure 114 disposed on the acoustic sensor membrane 104 between the acoustic sensor membrane 104 and the device substrate 102, as further described herein. In an embodiment, the second portion of the acoustic sensor membrane 104 can serve as an anchor or mechanical coupling of the acoustic sensor membrane 104 to the device substrate 102 by virtue of the integrated fabrication of the acoustic sensor membrane 104 on the device substrate 102 and subsequent membrane etch release as further described herein.

In a non-limiting aspect, the second portion of the acoustic sensor membrane 104 comprising exemplary lateral etch stop structure 114 can extend along an entire perimeter of the acoustic sensor membrane 104, including all sides of the acoustic sensor membrane 104. In an alternative embodiment, the second portion of the acoustic sensor membrane 104 comprising exemplary lateral etch stop structure 114 could attach the acoustic sensor membrane 104 to the device substrate 102 on less than all sides of the acoustic sensor membrane 104 (e.g., the longer sides, the shorter sides, etc.). In a further alternative embodiment, the second portion of the acoustic sensor membrane 104 comprising exemplary lateral etch stop structure 114 could be discontinuous along the perimeter of the acoustic sensor membrane 104, e.g., such that the acoustic sensor membrane 104 is attached to the device substrate 102 at discrete points along the perimeter of the acoustic sensor membrane 104.

As additionally shown in FIG. 4, a third portion 408 of the acoustic sensor membrane 104 can comprise one or more vents 220, which are openings that are formed into the third portion of the acoustic sensor membrane 104 and disposed substantially along a length of the acoustic sensor membrane 104. In the example shown in FIG. 4, the acoustic sensor membrane 104 has two vents 220, each of which are positioned along respective ones of the longer sides of the acoustic sensor membrane 104. It is noted that the one or more vents 220 could be positioned relative to the acoustic sensor membrane 104 in other ways, e.g., along the shorter sides of the membrane, along all sides of the membrane, etc. Alternative techniques for positioning one or more vents 220 within a rectangular membrane, as well as techniques for positioning one or more vents 220 within a non-rectangular membrane, are described in further detail below with respect to FIG. 5.

In the embodiment shown in FIG. 4, the one or more vents 220 are curved openings in the acoustic sensor membrane 104. In the example shown in FIG. 4, the one or more vents 220 are semi-elliptical openings, i.e., openings exhibiting a curved shape that forms a portion of an ellipse. These openings are also positioned such that a major axis of the ellipse corresponding to the shape of the one or more vents 220 is positioned along the sides of the acoustic sensor membrane 104.

As a result of the one or more vents 220 shown in FIG. 4, the active area of the acoustic sensor membrane 104, e.g., the first portion of the acoustic sensor membrane 104, also referred to herein as a sensing area or an electrode 402, of the acoustic sensor membrane 104, is a non-rectangular area having a width at the center of the first portion of the acoustic sensor membrane 104, that is less than a width of the short edges of the acoustic sensor membrane 104 to which the first portion (e.g., sensing area or an electrode 402) of the acoustic sensor membrane 104 is attached. When tension is applied to the short edges of the acoustic sensor membrane 104, this results in the first portion of the acoustic sensor membrane 104, also referred to herein as a sensing area or an electrode 402, of the acoustic sensor membrane 104 exhibiting a shape that is similar to that of a hammock, e.g., with the ends of the first portion of the acoustic sensor membrane 104, also referred to herein as a sensing area or an electrode 402, being pulled apart and the center of the first portion of the acoustic sensor membrane 104, also referred to herein as a sensing area or an electrode 402, being suspended. Additionally, due to the curvature of the one or more vents 220 shown in FIG. 4, wrinkling of the acoustic sensor membrane 104 while under tension can be reduced, e.g., as compared to an implementation using straight (non-curved) vents.

By utilizing an acoustic sensor membrane 104 with one or more vents 220 as shown in FIG. 4, the compliance of the acoustic sensor membrane 104 can be improved, which can in turn improve the sensitivity of an underlying acoustic sensor, in a non-limiting aspect. Additionally, the one or more vents 220 can enable the flow of air from the front of an underlying acoustic sensor to the back, which can be utilized to enable the acoustic sensor membrane 104 to function as a microphone as well as to set its corresponding low frequency corner, in a further non-limiting aspect.

As further shown in the inset of FIG. 4 of the acoustic sensor membrane 104 and the second portion of the acoustic sensor membrane 104 comprising exemplary lateral etch stop structure 114, various exemplary embodiments can comprise one or more of a set of membrane position control structures 110 (e.g., in a singular sequence 410 or in array or multiple sequences 412, each of which can extend about the periphery of the acoustic sensor membrane 104 according the shape, feature set of the membrane including one or more vents, and so on) or a set of etch release structures 112, as further described herein regarding FIGS. 1-3.

Figure 5:
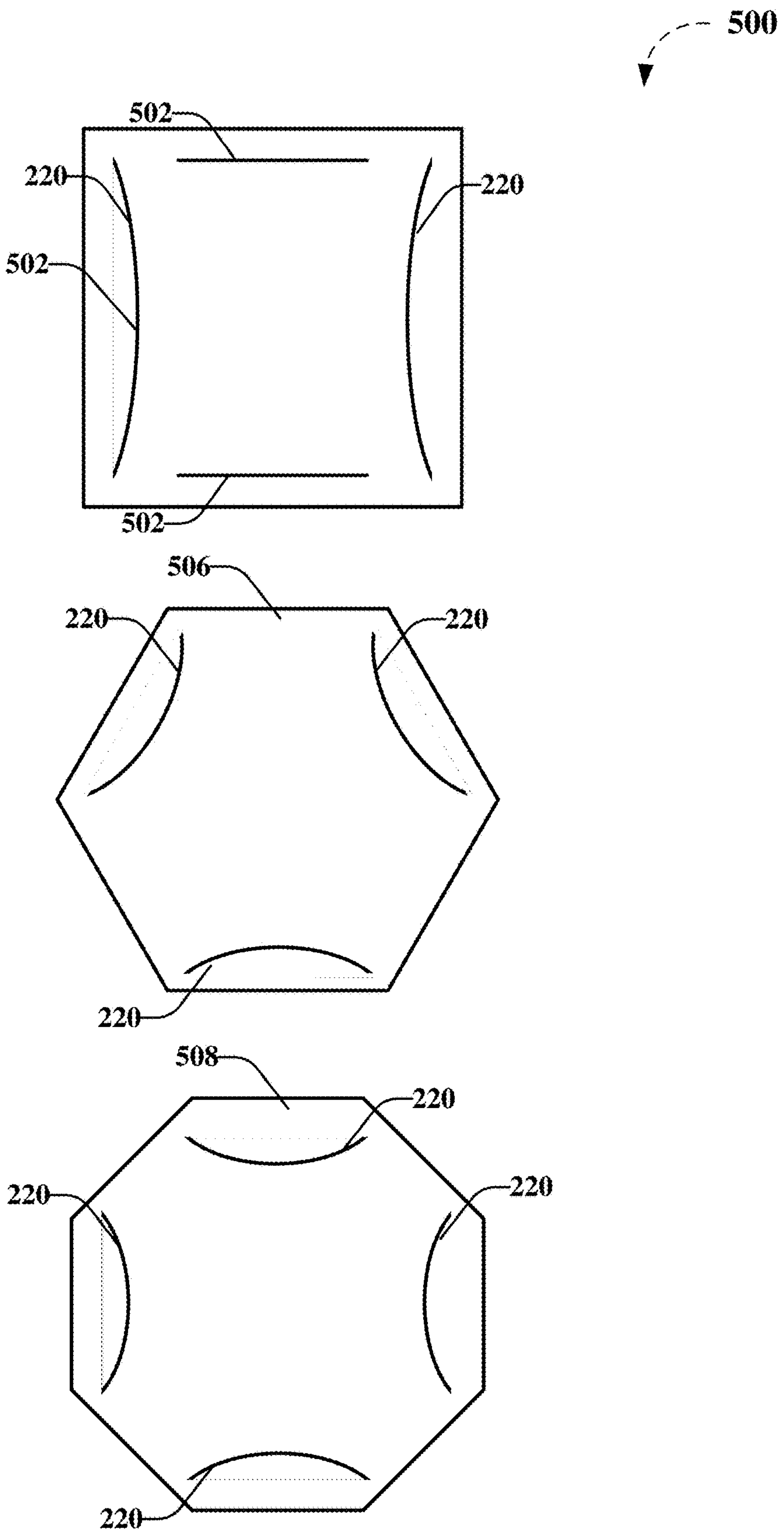
FIG. 5 depicts further non-limiting aspects of an exemplary acoustic sensor membrane suitable for use in exemplary MEMS acoustic sensors described herein

FIG. 5 depicts further non-limiting aspects of exemplary acoustic sensor membranes 500 suitable for use in exemplary MEMS acoustic sensors 100 described herein. In FIG. 5, exemplary acoustic sensor membranes 502, 506, 508 depict respective MEMS acoustic sensor 100 membrane configurations are provided. While various examples described above relate to the specific example of a rectangular membrane, a membrane as described herein can be of any suitable polygonal shape, such as a quadrilateral (e.g., a square, a rectangle, etc.), a hexagon, an octagon, or the like. For instance, in an example shown by exemplary acoustic sensor membrane 502 in FIG. 5, a square acoustic sensor membrane 502 can be used in which respective one or more curved vents 220 can be disposed along opposite sides of the square acoustic sensor membrane 502, e.g., as described above for the case of a rectangular membrane. As further shown in exemplary acoustic sensor membrane 502, one or more straight vents 504 can be disposed along the sides of the square acoustic sensor membrane 502 that are not associated with one or more curved vents 220.

As another example illustrated in FIG. 5, a hexagonal acoustic sensor membrane 506 can have three curved vents 220 positioned along alternating sides of the hexagonal acoustic sensor membrane 506. Similarly, an octagonal acoustic sensor membrane 508 as illustrated in FIG. 5 can have four curved vents 220 that are similarly positioned along alternating sides of the octagonal acoustic sensor membrane 508. To generalize, for a polygonal membrane having an even number n of sides, n/2 vents 220 can be formed into the membrane and positioned at alternating sides of the membrane, i.e., every other side of the membrane, which can be extended to other shapes such as circles, ellipses, and so on, where the number of the one or more vents 220 employed can vary but can be determined as for a rectangle or a polygonal shape as above.

Not shown in FIG. 5 are the first portion of the acoustic sensor membrane 104, also referred to herein as a sensing area or an electrode 402, the second portion of the acoustic sensor membrane 104 comprising exemplary lateral etch stop structure 114, and the set of etch release structures 112.

Figure 6:
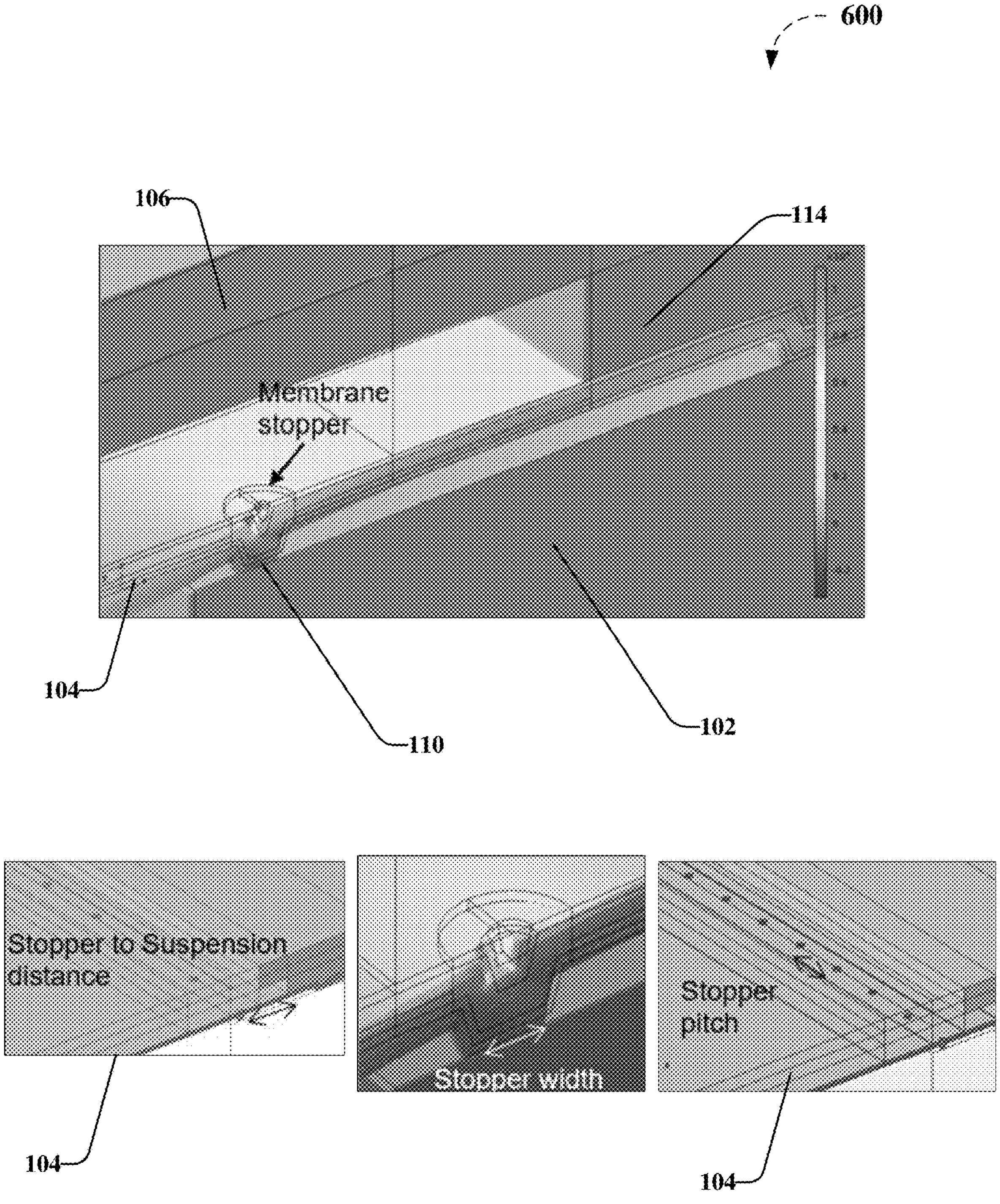
FIG. 6 depicts particular aspects of non-limiting membrane position control structures suitable for use in exemplary MEMS acoustic sensors described herein.
Figure 7:
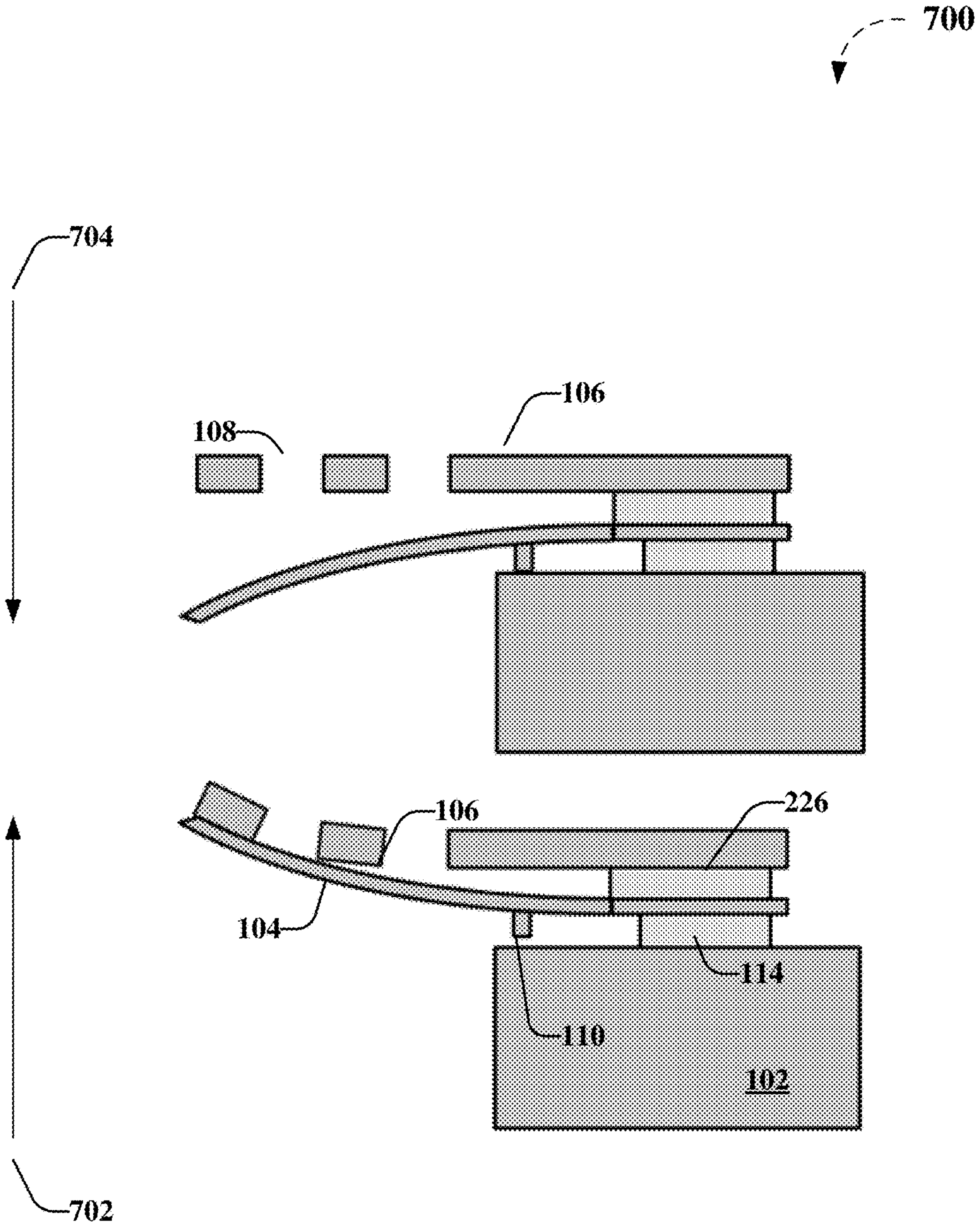
FIG. 7 illustrates particular aspects of non-limiting membrane position control structures suitable for use in exemplary MEMS acoustic sensors described herein.

FIG. 6 provides perspective diagrams 600 that depict particular aspects of non-limiting membrane position control structures 110, referred to in FIG. 6 as a membrane stopper, suitable for use in exemplary MEMS acoustic sensors described herein. FIG. 7 provides a functional block diagram 700 that illustrates particular aspects of non-limiting membrane position control structures 110 suitable for use in exemplary MEMS acoustic sensors 100 described herein. Not shown in FIGS. 6-7 are the one or more vents 220 and the set of etch release structures 112. As further described herein, the number, position (e.g., pitch and distance), configuration (shape and/or construction), and arrangement (relative to other components such as the suspension, one or more vents 220, the set of etch release structures 112) of the exemplary membrane position control structures 110 can vary, without limitation. As depicted in FIG. 7, a positive pressure impulse 702 of an applied acoustic pressure can deflect the acoustic sensor membrane 104 in a direction toward the acoustic sensor backplate or top plate 106, which deflection can be limited by the one or more backplate or top plate 106 stops 218 (not shown). However, in the instance of the negative pressure impulse 704 of an applied acoustic pressure can deflect the acoustic sensor membrane 104 in a direction toward the device substrate, which can be accommodated in part by the exemplary membrane position control structures 110 and/or the front cavity 224. Nevertheless, a bending stress on the acoustic sensor membrane 104 will arise at the junction between the lateral etch stop structure 114 disposed on the acoustic sensor membrane 104 and the backplate or top plate 106 lateral etch stop structure 226. Thus, in various non-limiting embodiments, position control of the acoustic sensor membrane 104 via an exemplary set of membrane position control structures 110 of exemplary MEMS acoustic sensor 100 can be employed. As described, an exemplary set of membrane position control structures 110 of exemplary MEMS acoustic sensor 100 can be arranged in a singular sequence of membrane position control structures near the periphery of the acoustic sensor membrane 104, multiple sequences of membrane position control structures near the periphery of the acoustic sensor membrane 104, and/or other arrangements, configurations and/or numbers which can be configured to limit movement of the acoustic sensor membrane 104 in a direction away from the acoustic sensor backplate or top plate 106 or reduce bending stress on the acoustic sensor membrane 104 at a junction of the acoustic sensor membrane 104 and the lateral etch stop structure 114, thereby reducing bending stress on the acoustic sensor membrane 104 at a junction of the acoustic sensor membrane 104 and the lateral etch stop structure 114.

Figure 8:
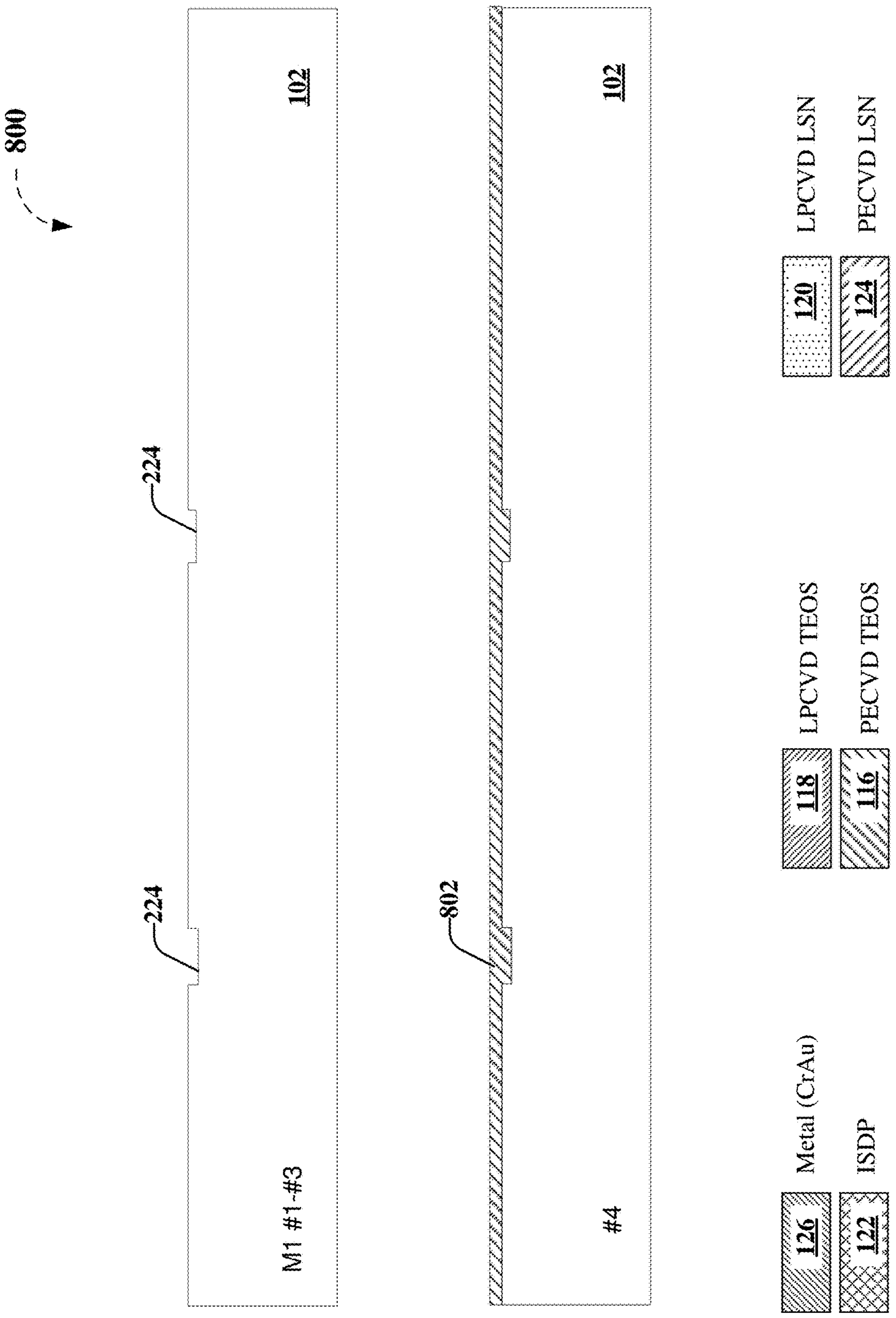
FIGS. 8-31 illustrate example, non-limiting, cross-sectional views of exemplary MEMS acoustic sensors undergoing fabrication processes in accordance with one or more embodiments described herein.

Thus, in various non-limiting embodiments, the disclosed subject matter provides robust MEMS acoustic sensors 100. As further provided herein, it is demonstrated that such robust MEMS acoustic sensors 100 can be fabricated based on a low cost process. it can be understood that production costs of a MEMS device roughly follows the number of lithography steps (and as a consequence, the number of lithography masks employed) that are used to pattern the various layers of the MEMS device. Accordingly, FIGS. 8-31 illustrate example, non-limiting, cross-sectional views of exemplary MEMS acoustic sensors 100 undergoing fabrication processes in accordance with one or more embodiments described herein, in which, FIG. 8 depicts a starting device substrate 102 suitable for use in exemplary MEMS acoustic sensors 100 described herein. Repetitive description of like elements employed in other embodiments described herein is omitted for sake of brevity. Note that the process figures are annotated with non-limiting process step numbers for the purposes of illustration and not limitation. In addition, various figures are labeled M1, M2, etc. to reflect the number and specificity of lithography masks used in the process or for particular steps, as an illustration of the economic benefits of a low mask count MEMS acoustic sensor 100 fabrication process. It should be understood that such specific process details do not limit the scope of the appended claims.

Accordingly, FIG. 8 depicts a starting device substrate 102 suitable for use in exemplary MEMS acoustic sensors 100 described herein, in which device substrate 102 is marked, clean and the front cavity 224 is lithographically defined (e.g., via mask M1) and etched into the device substrate 102. Subsequently, the front cavities are filled 802 with oxide, e.g., PECVD TEOS 116, as further described herein. As further described herein, for example, regarding FIG. 3, this lithography step (and consequently mask M1 and related etch and deposition steps) can be eliminated by elimination of the exemplary front cavity 224 from the fabrication process and resulting devices based on the employment of a number or array (e.g., multiple sequences) of membrane position control structures 110, for example, as further describe herein regarding FIG. 3, thereby providing further economic advantage of the exemplary MEMS acoustic sensors 100.

Figure 9:
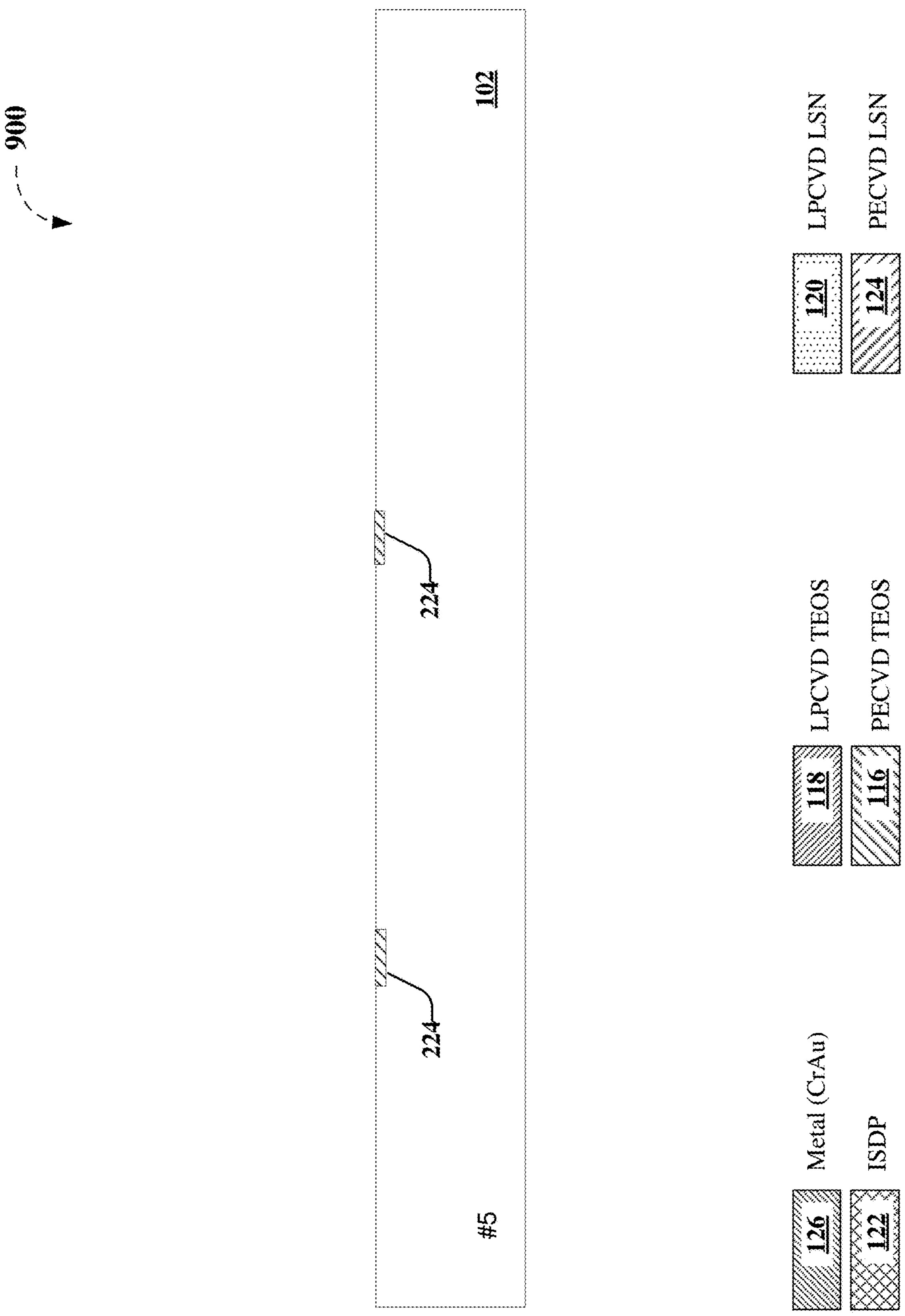
Figure 10:
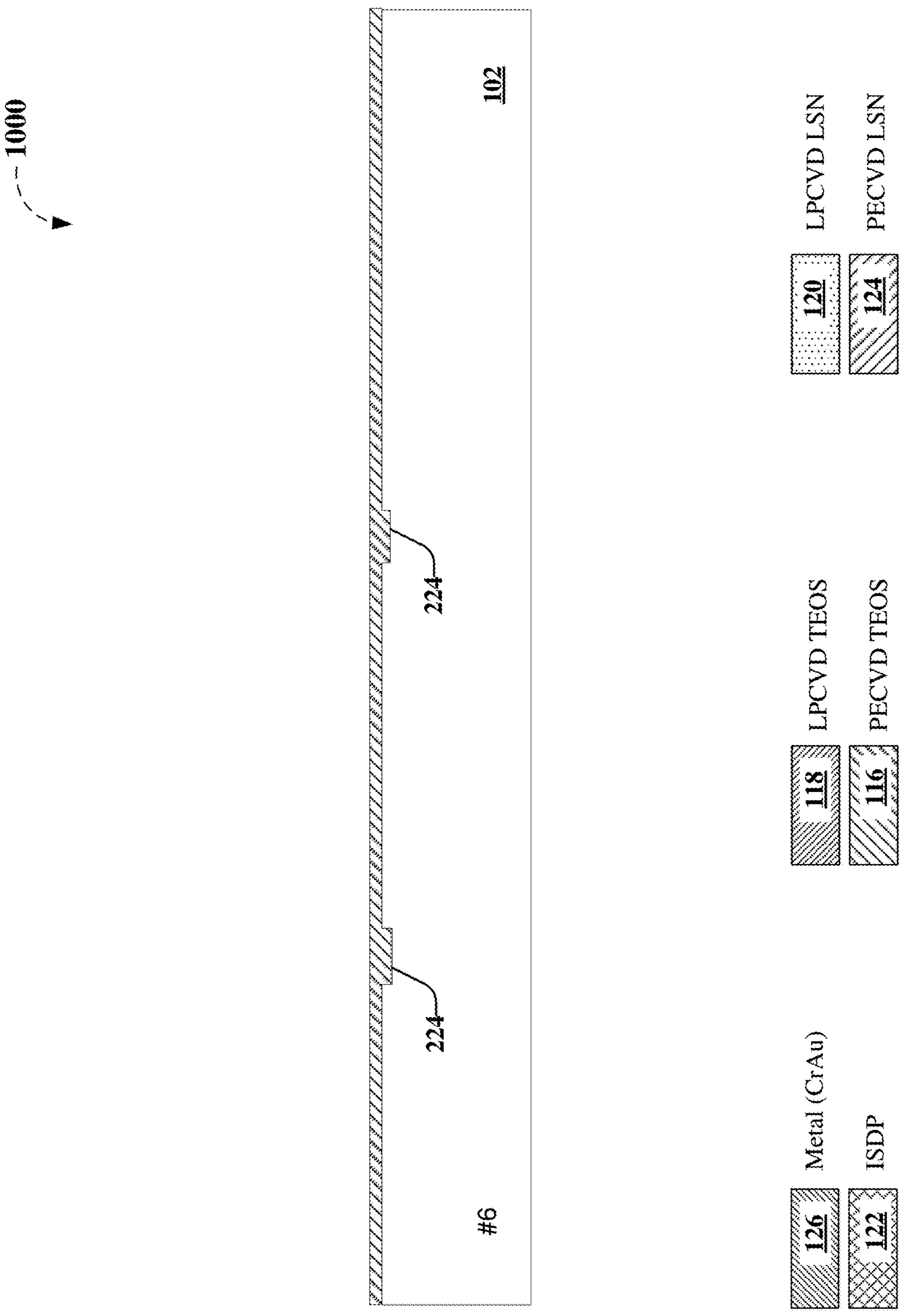
Figure 11:
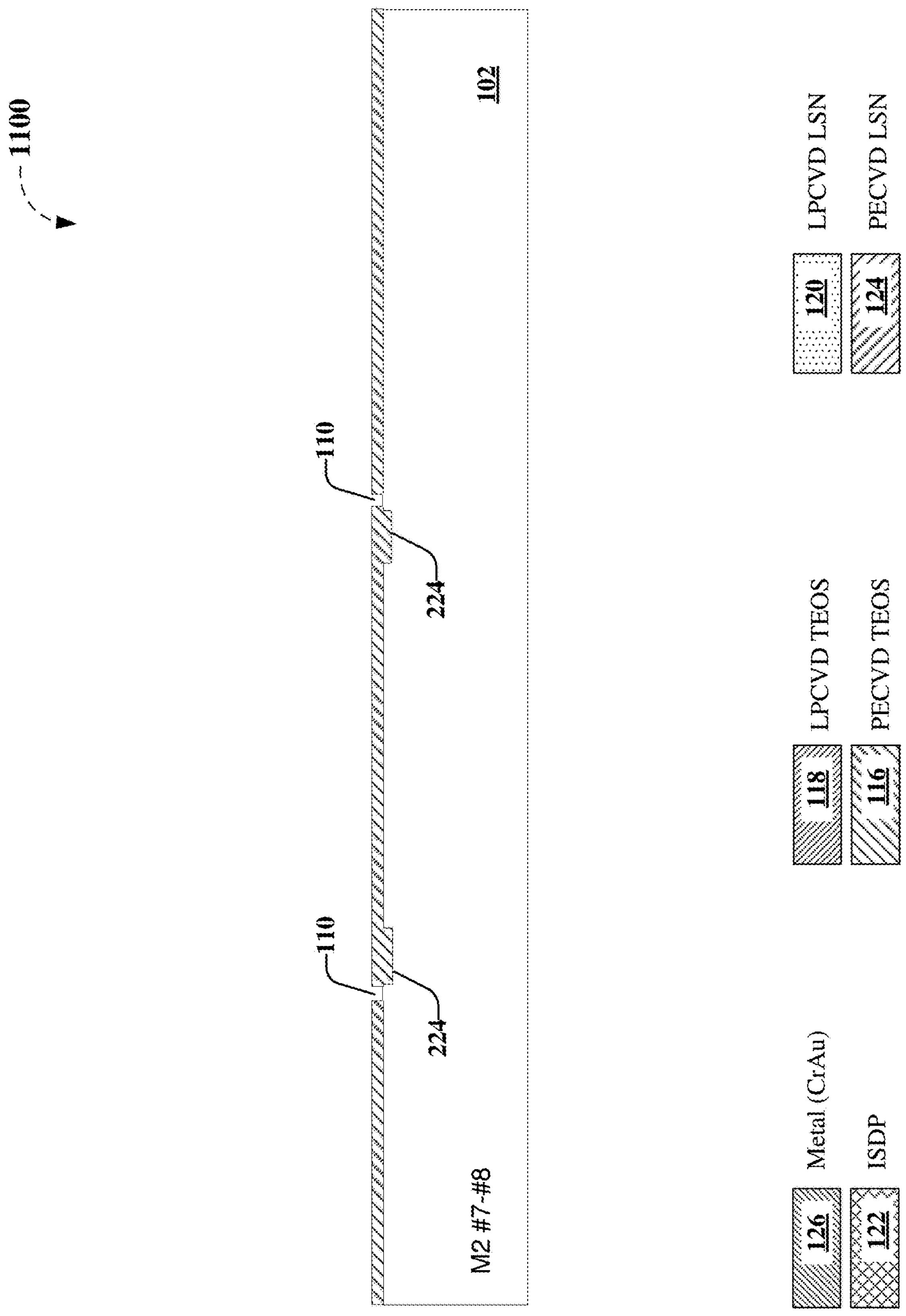

FIG. 9 depicts results 900 of a chemical/mechanical polish (CMP) step that retains the front cavity 224 of device substrate 102 filled with oxide, e.g., PECVD TEOS 116. FIG. 10 depicts results 1000 of a bulk oxide deposition, e.g., PECVD TEOS 116. FIG. 11 depicts exemplary fabrication process results 1100, in which exemplary membrane position control structures 110 (e.g., a single sequence of membrane position control structures 110) are lithographically defined (e.g., via mask M2) and etched into the bulk oxide deposition, e.g., PECVD TEOS 116, deposited on device substrate 102 as depicted in FIG. 10. As noted above, elimination of the exemplary front cavity 224 from the fabrication process and resulting devices can be facilitated by the employment of a number or array (e.g., multiple sequences) of membrane position control structures 110, for example, as further describe herein regarding FIG. 3, which would result in a variation of the results 1100.

Figure 12:
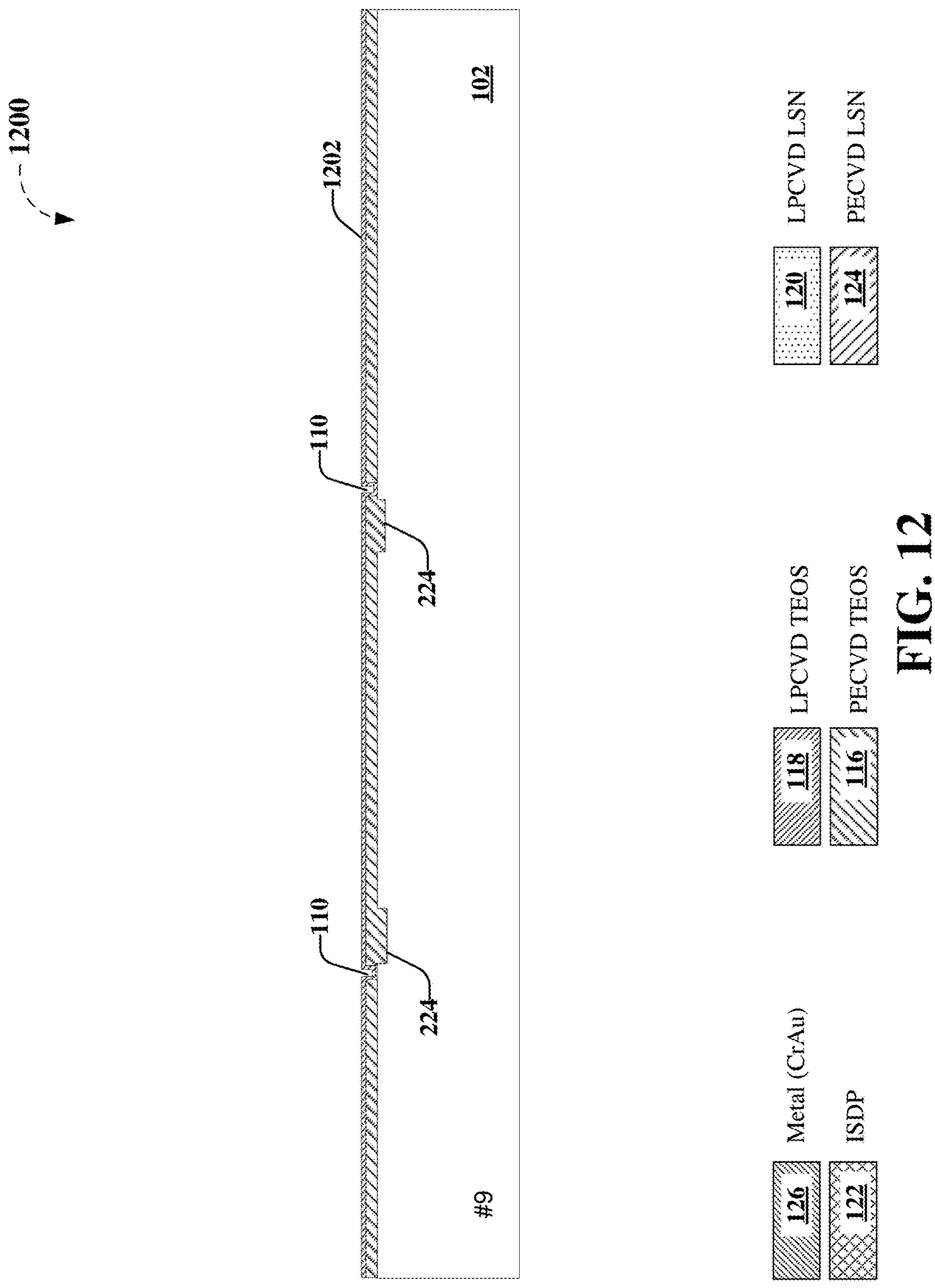
Figure 13:
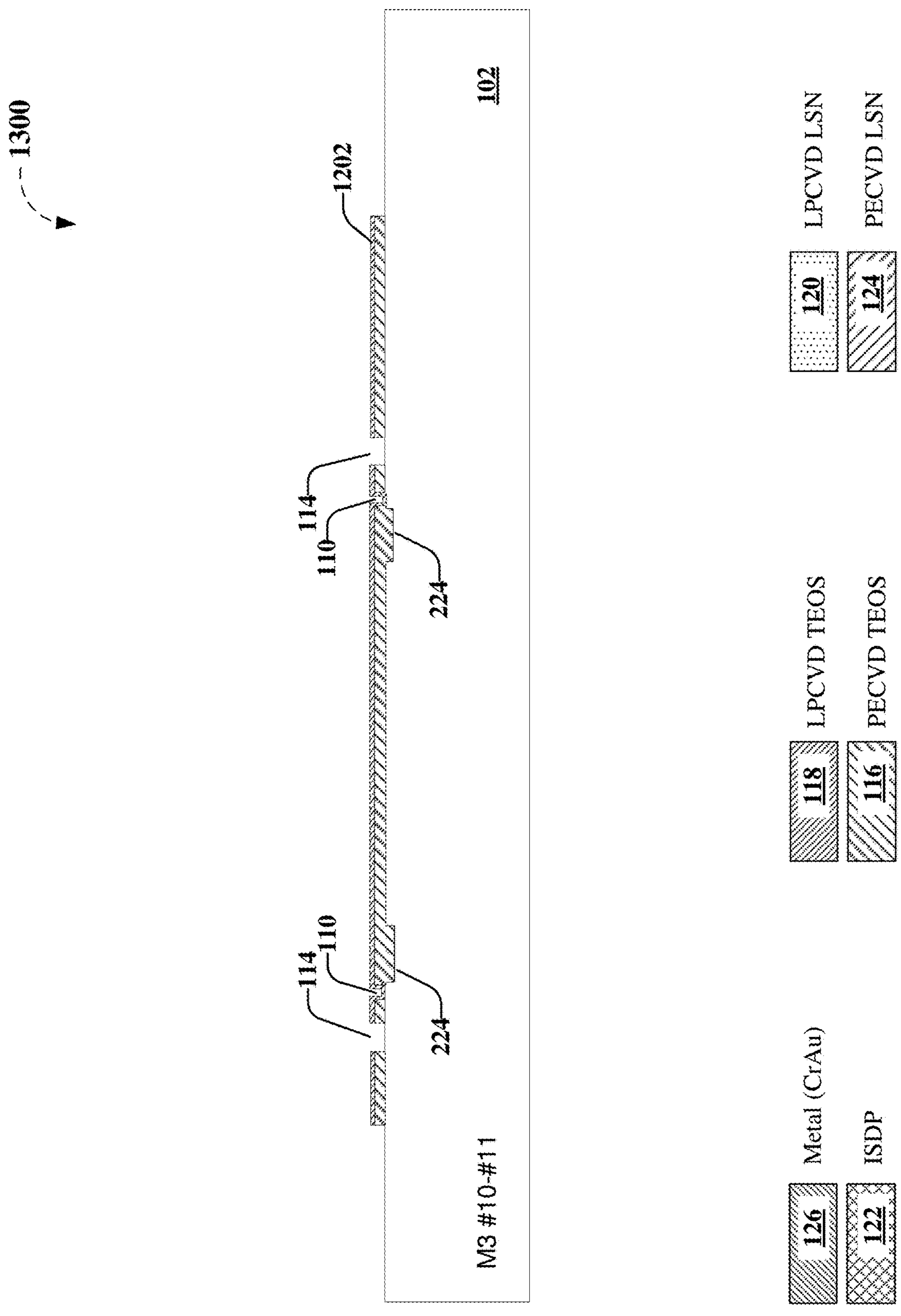

FIG. 12 depicts results 1200 of a deposition of an oxide, e.g., LPCVD TEOS 118, employed as a spacer 1202 on the bulk oxide deposition, e.g., PECVD TEOS 116. FIG. 13 depicts exemplary fabrication process results 1300, in which exemplary lateral etch stop structure 114 is lithographically defined (e.g., via mask M3) and etched through the spacer 1202 oxide, e.g., LPCVD TEOS 118, and the bulk oxide deposition, e.g., PECVD TEOS 116, deposited on the device substrate 102.

Figure 14:
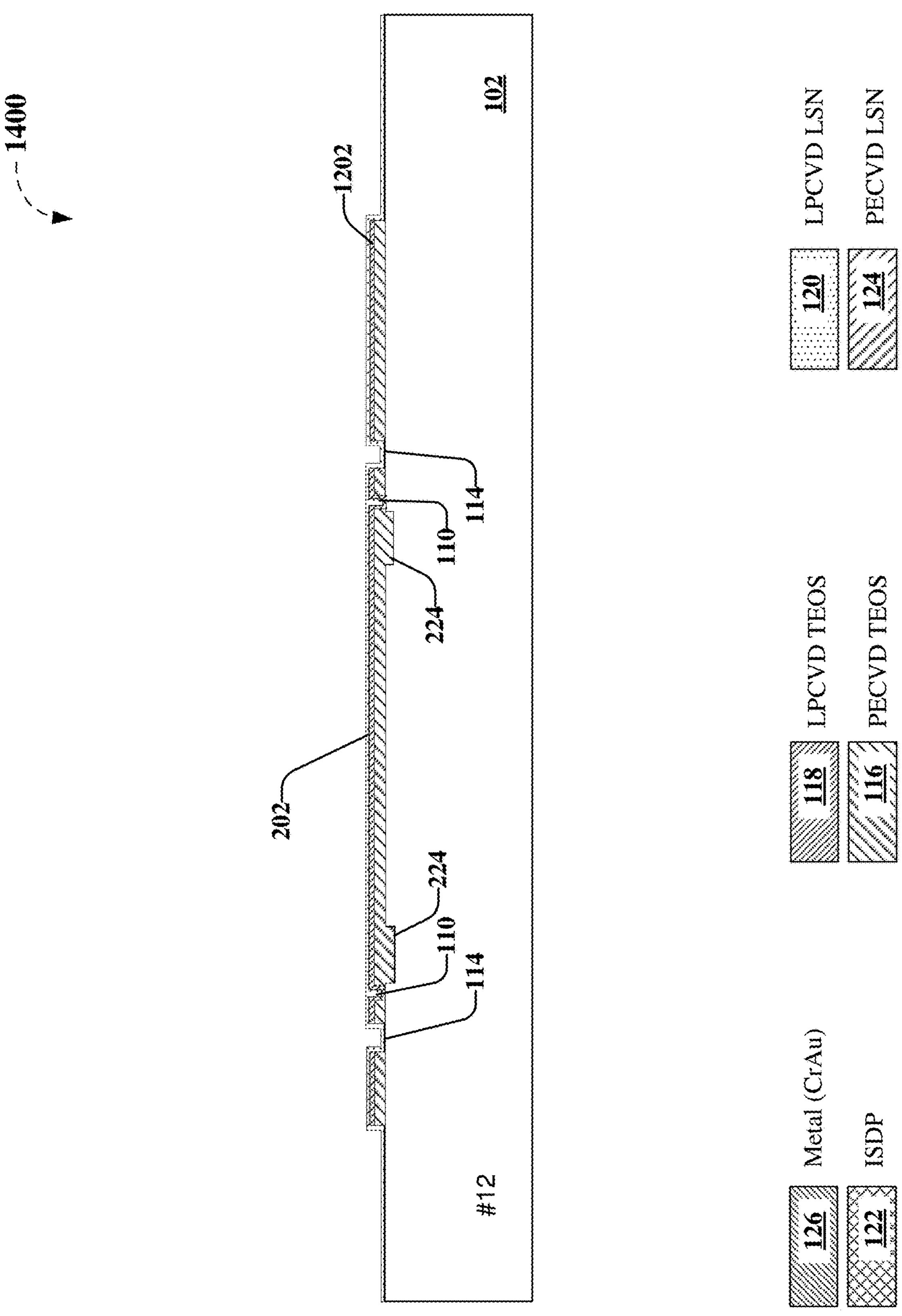
Figure 15:
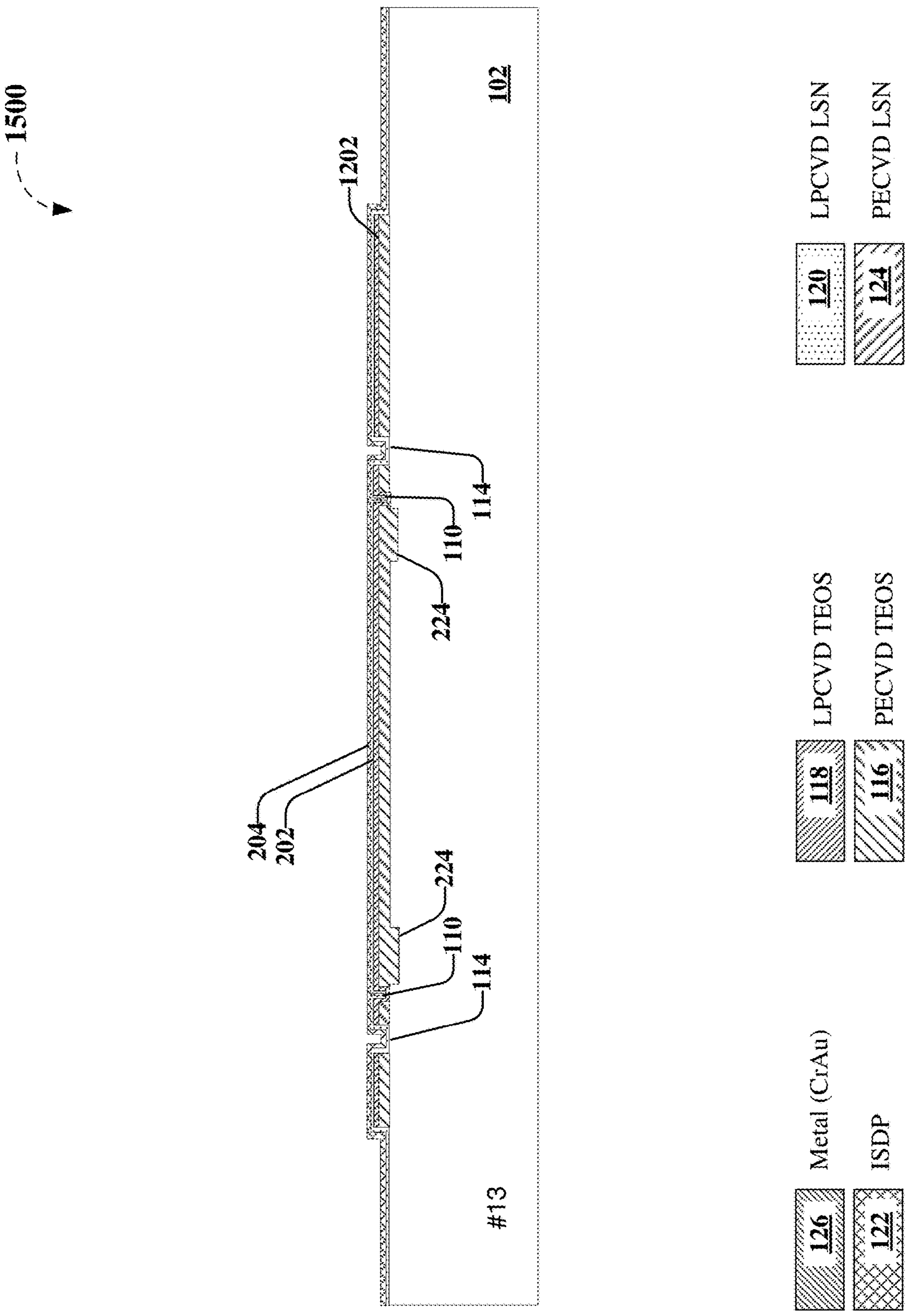
Figure 16:
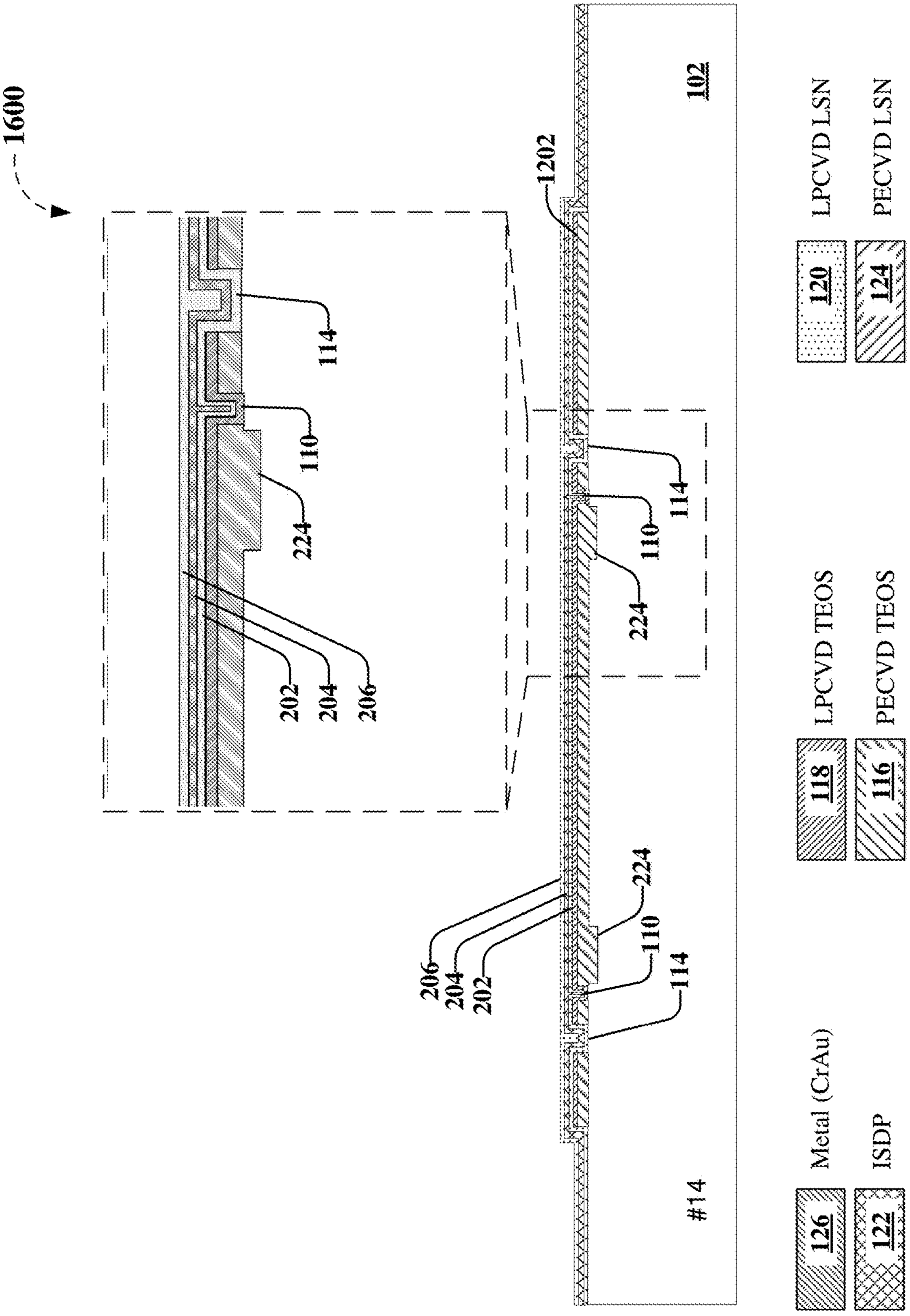

FIG. 14 depicts results 1400 of a deposition of a first SiN acoustic sensor membrane 104 layer 202, e.g., LPCVD LSN 120. FIG. 15 depicts results 1500 of a deposition of a poly-Si acoustic sensor membrane 104 electrode layer 204, e.g., ISDP 122. FIG. 16 depicts results 1600 of a deposition of a second SiN acoustic sensor membrane 104 layer 206, e.g., LPCVD LSN 120.

Figure 17:
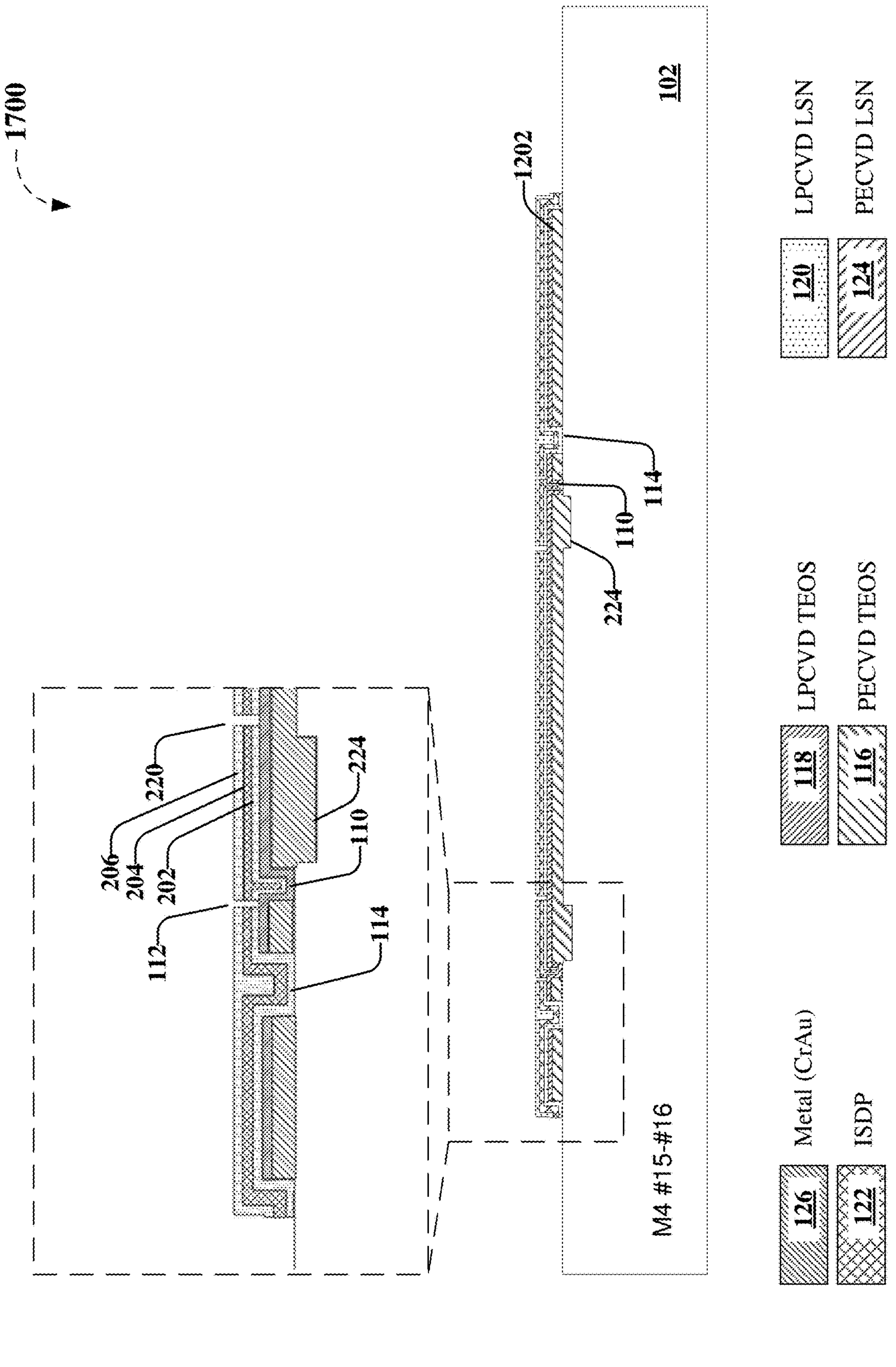

FIG. 17 depicts exemplary fabrication process results 1700, in which the extent and critical dimensions of the features (e.g., one or more vents 220, the set of etch release structures 112, and so on) for the exemplary acoustic sensor membrane 104 is lithographically defined (e.g., via mask M4) and etched through the exemplary acoustic sensor membrane 104 that comprises a stacked arrangement of a first silicon nitride (SiN) acoustic sensor membrane 104 layer 202, a polycrystalline silicon (poly-Si) acoustic sensor membrane 104 electrode layer 204, and a second SiN acoustic sensor membrane 104 layer 206.

Figure 18:
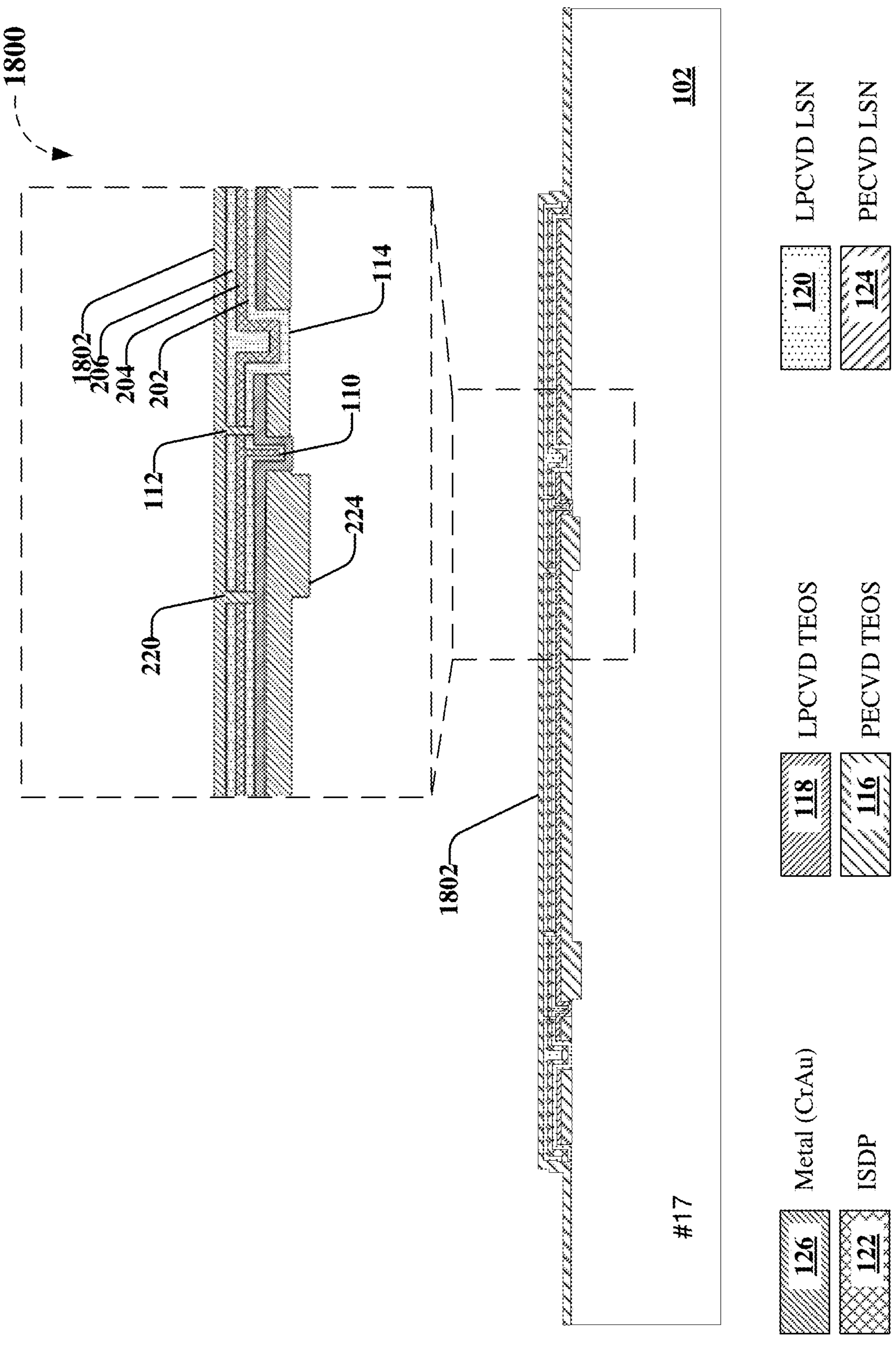

FIG. 18 depicts results 1800 of a deposition of an oxide layer that can also be referred to as a first airgap oxide 1802, e.g., PECVD TEOS 116, portions of which will be etched in subsequent steps to release the acoustic sensor membrane 104 from the exemplary acoustic sensor backplate or top plate 106, as further described herein.

Figure 19:
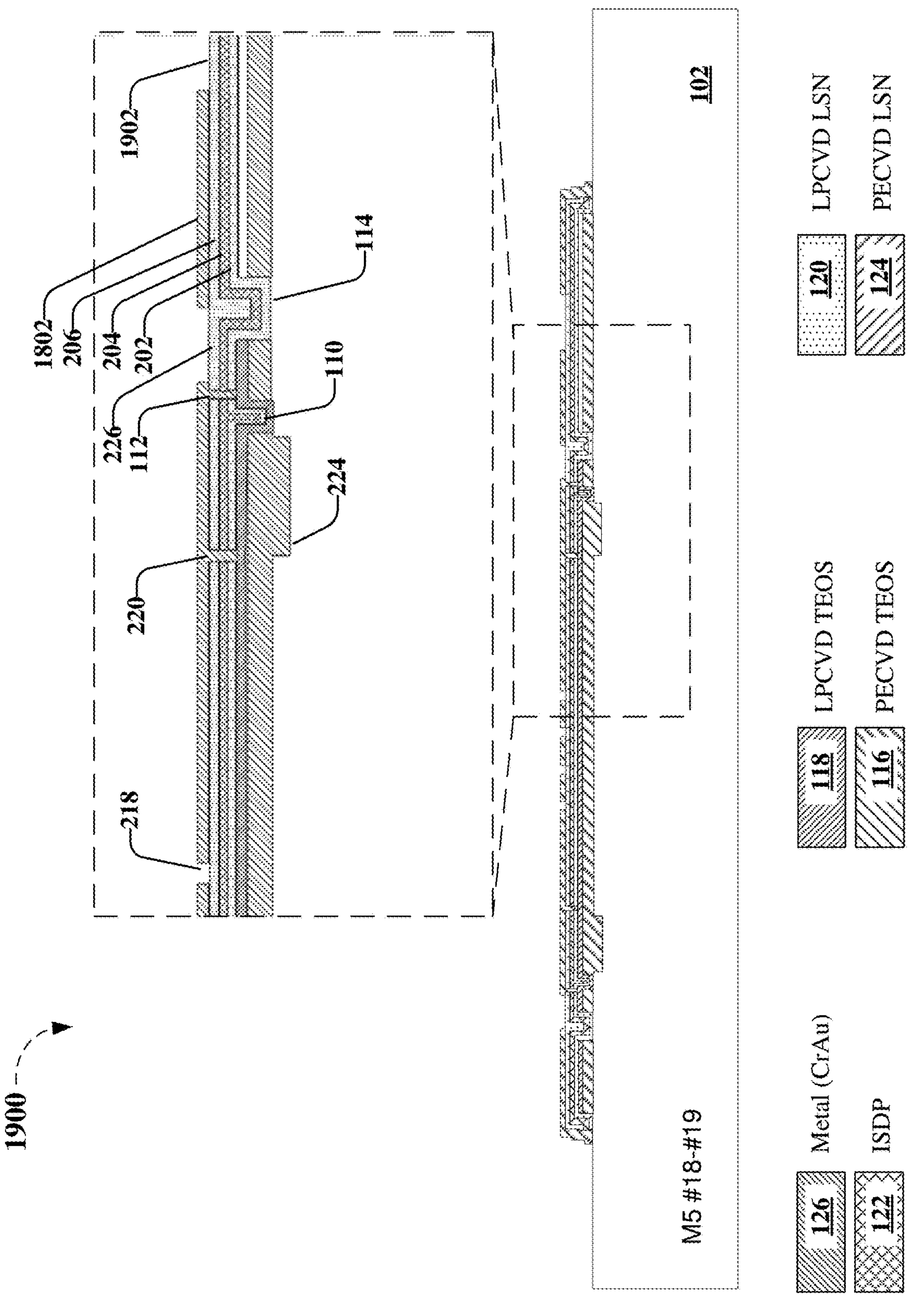

FIG. 19 depicts exemplary fabrication process results 1900, in which the extent and critical dimensions of the features (e.g., one or more backplate or top plate 106 stops 218, exemplary backplate or top plate 106 lateral etch stop structure 226, and so on) for the exemplary backplate or top plate 106 is lithographically defined (e.g., via mask M5) and etched through the first airgap oxide 1802, e.g., PECVD TEOS 116. In addition the structure 1902 associated with the poly-Si contact 208 coupled to the poly-Si acoustic sensor membrane 104 electrode layer 204 can be defined and etched.

Figure 20:
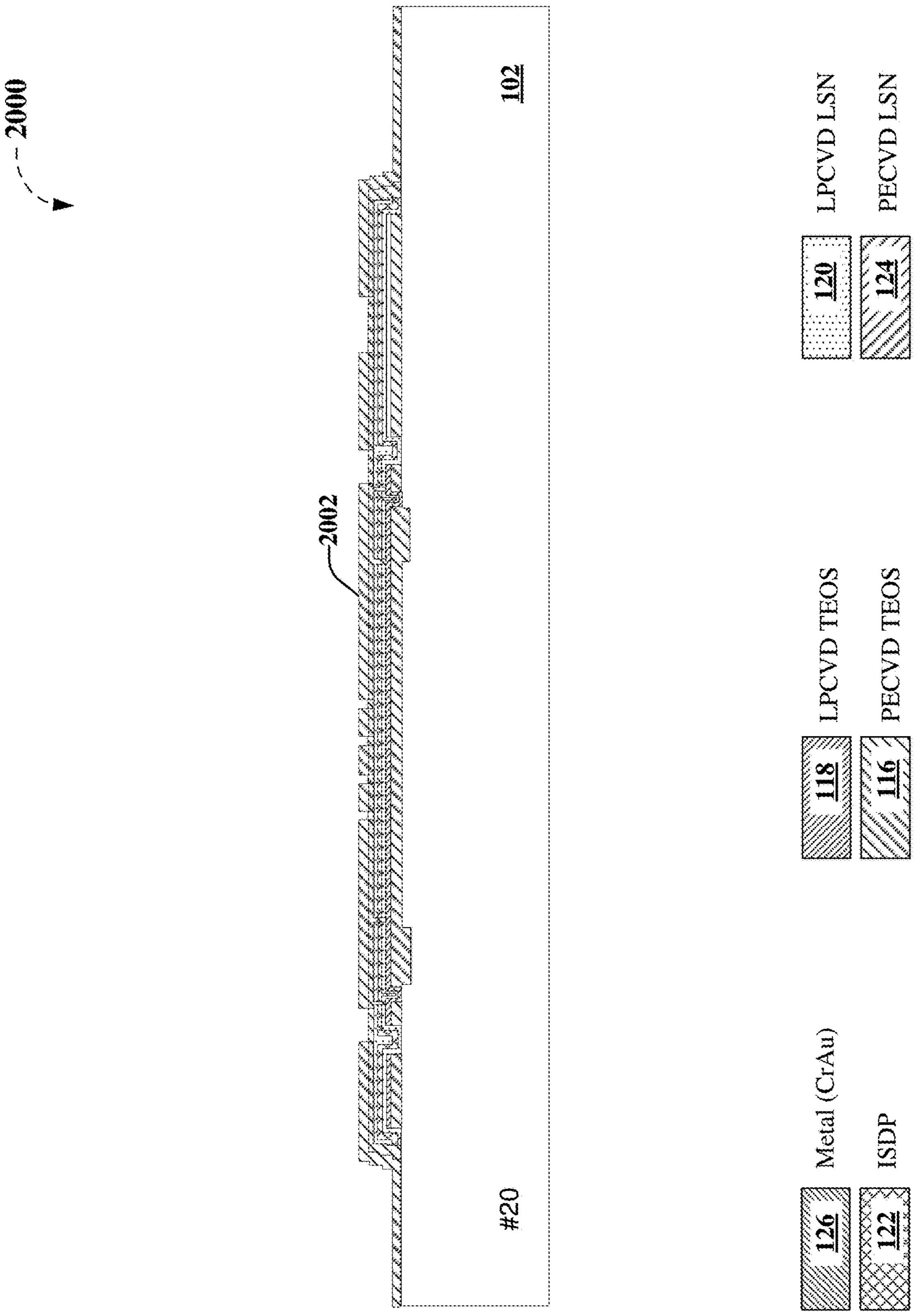

FIG. 20 depicts exemplary fabrication process results 2000 of a deposition of an oxide layer that can also be referred to as a second airgap oxide 2002, e.g., PECVD TEOS 116, portions of which will be etched in subsequent steps to release the acoustic sensor membrane 104 from the exemplary acoustic sensor backplate or top plate 106, as further described herein.

Figure 21:
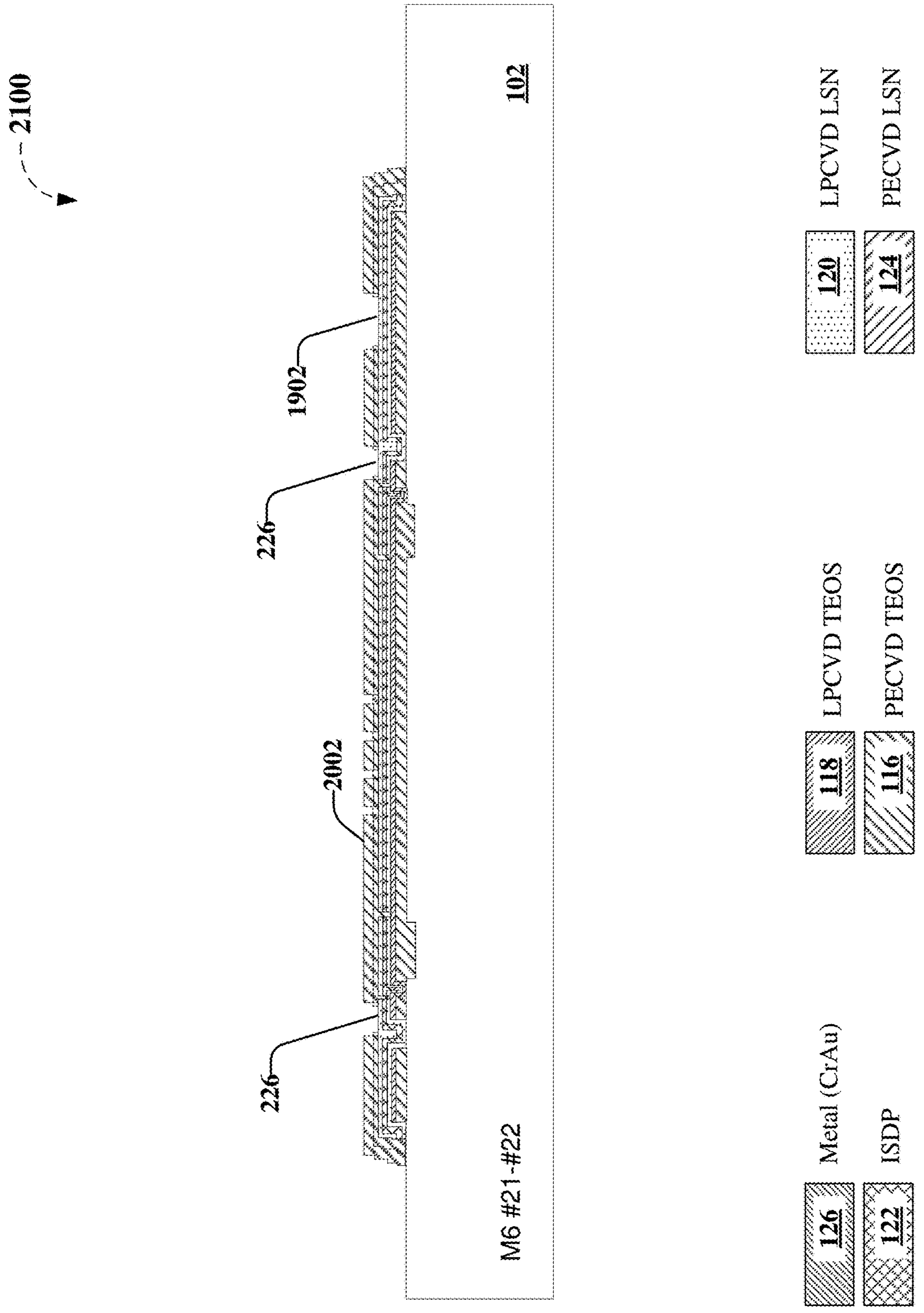

FIG. 21 depicts exemplary fabrication process results 2100, in which the extent and critical dimensions of the features (e.g., exemplary backplate or top plate 106 lateral etch stop structure 226, and so on) for the exemplary backplate or top plate 106 is lithographically defined (e.g., via mask M6) and etched through the second airgap oxide 2002 (e.g., airgap oxide), e.g., PECVD TEOS 116. In addition the structure 1902 associated with the poly-Si contact 208 coupled to the poly-Si acoustic sensor membrane 104 electrode layer 204 can be defined and etched. The etch of the etched areas can terminate at the second SiN acoustic sensor membrane 104 layer 206, e.g., LPCVD LSN 120, as depicted in FIG. 16.

Figure 22:
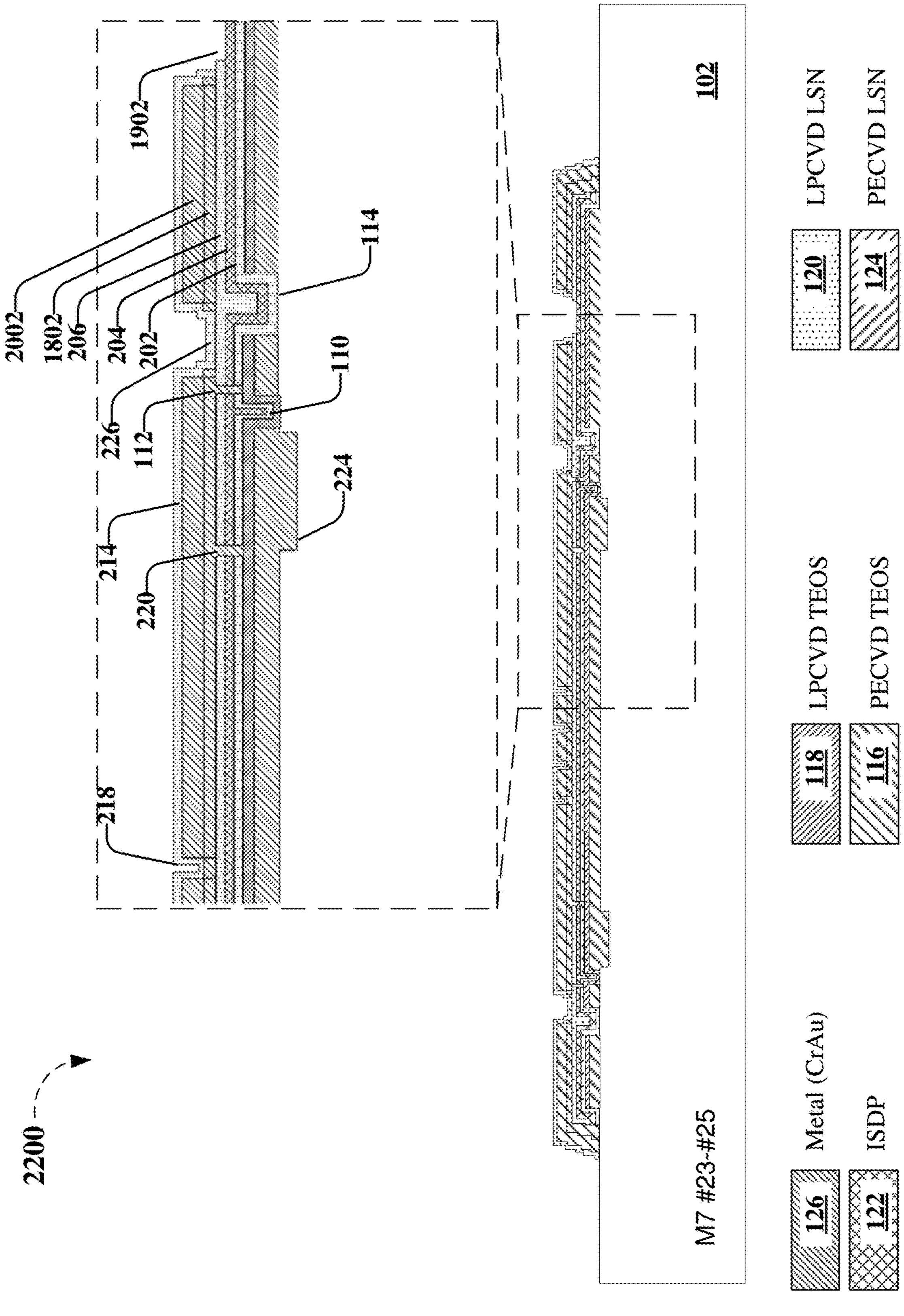

FIG. 22 depicts exemplary fabrication process results 2200, in which the first SiN backplate or top plate 106 layer 214 is deposited, e.g., LPCVD LSN 120. In addition, FIG. 22. depicts exemplary fabrication process results 2200, in which the extent and critical dimensions of the features (e.g., the structure 1902 associated with the poly-Si contact 208 coupled to the poly-Si acoustic sensor membrane 104 electrode layer 204, and so on) is lithographically defined (e.g., via mask M7) and etched through the deposited first SiN backplate or top plate 106 layer 214 is deposited, e.g., LPCVD LSN 120.

Figure 23:
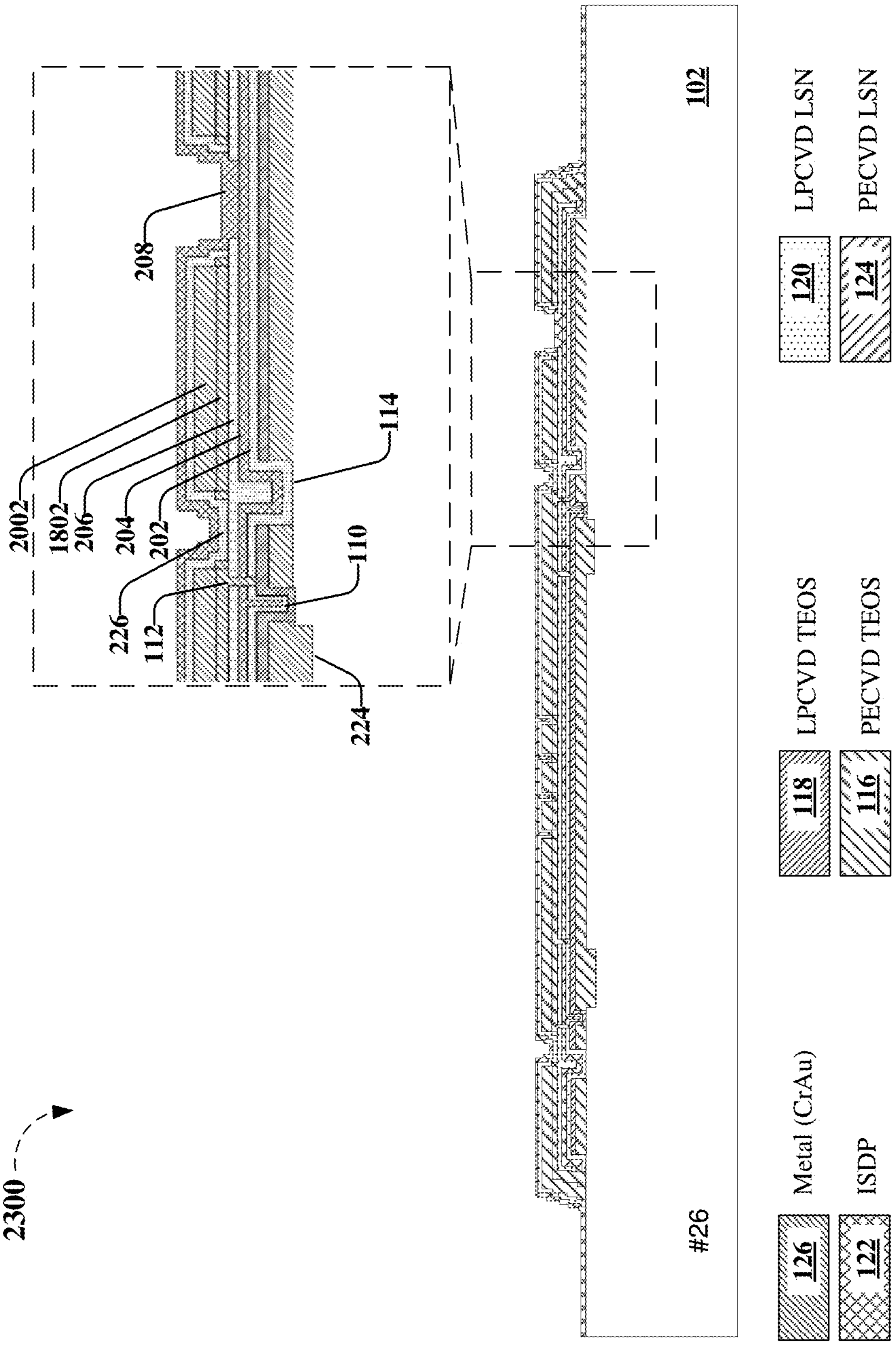

FIG. 23 depicts exemplary fabrication process results 2300 of a deposition of a polycrystalline silicon, e.g., ISDP 122, layer to form exemplary poly-Si contact 208 coupled to the poly-Si acoustic sensor membrane 104 electrode layer 204 and poly-Si backplate or top plate 106 electrode layer 210 adjacent to first SiN backplate or top plate 106 layer 214, which deposition can be accompanied by an anneal step.

Figure 24:
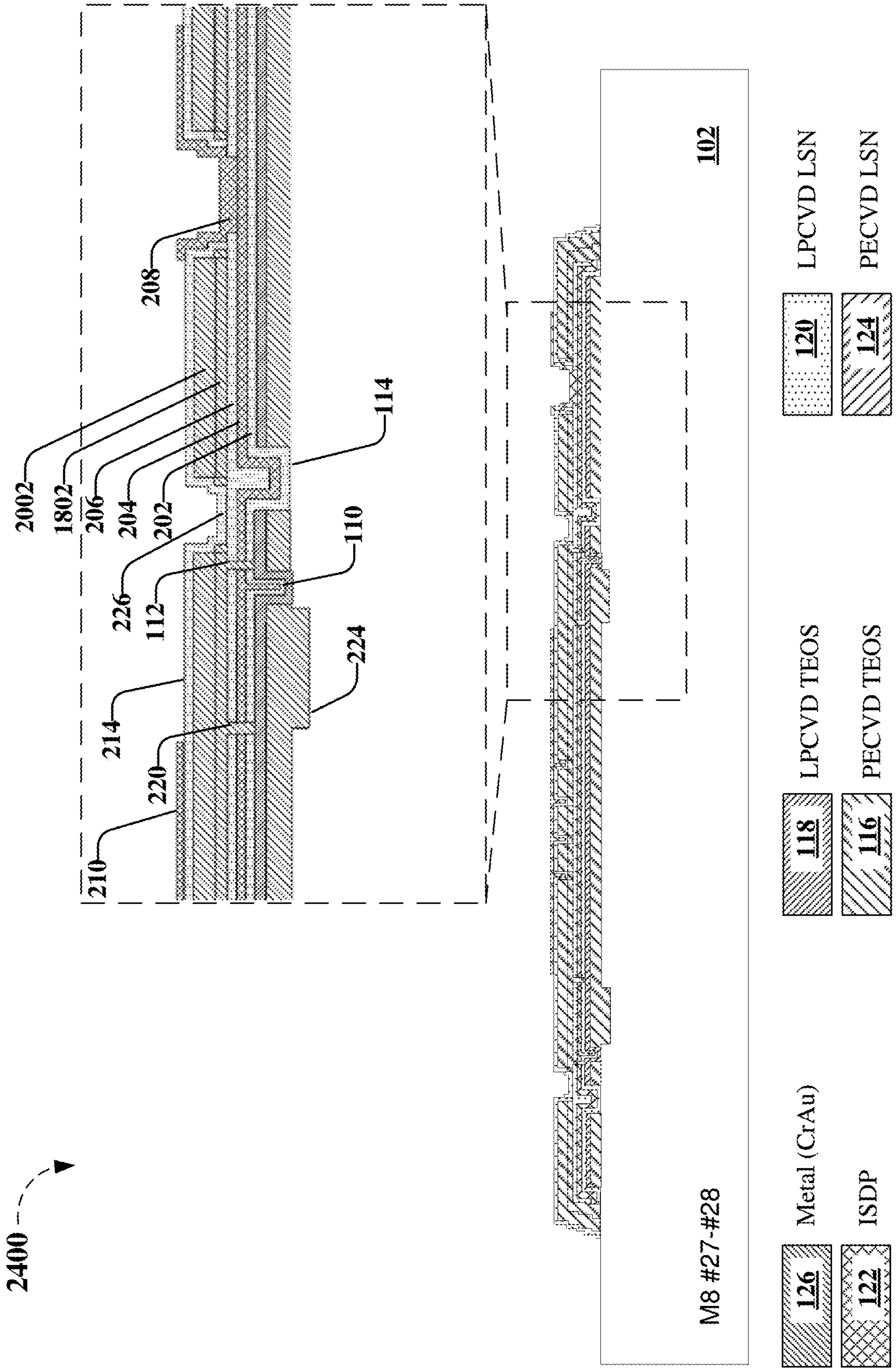

FIG. 24 depicts exemplary fabrication process results 2400, in which the extent and critical dimensions of the features (e.g., poly-Si contact 208 coupled to the poly-Si acoustic sensor membrane 104 electrode layer 204 and poly-Si backplate or top plate 106 electrode layer 210 adjacent to first SiN backplate or top plate 106 layer 214, and so on) is lithographically defined (e.g., via mask M8) and etched.

Figure 25:
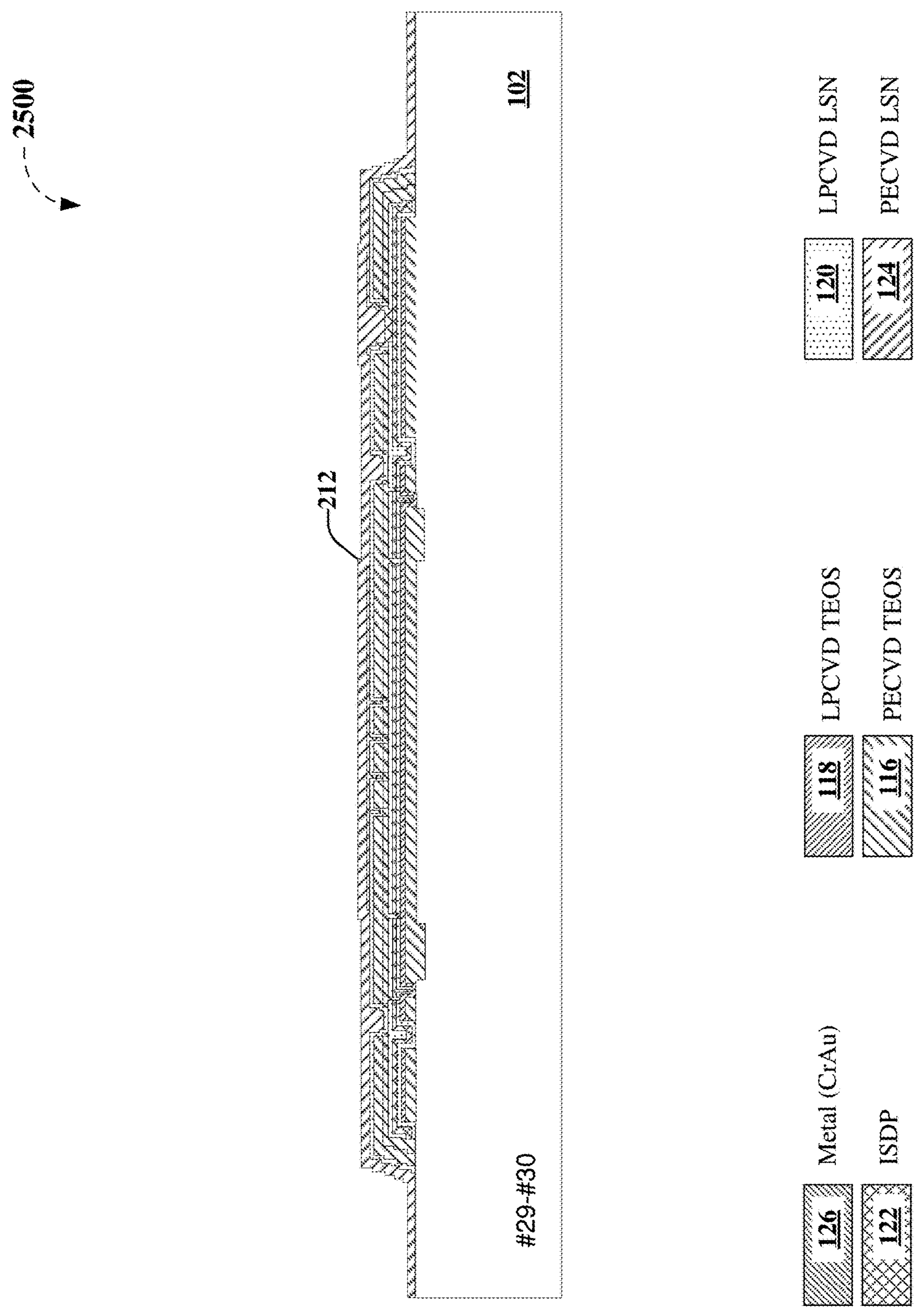

FIG. 25 depicts exemplary fabrication process results 2500 of a deposition of a second SiN backplate or top plate 106 layer 212, e.g., PECVD LSN 124, which deposition can be accompanied by an anneal step, depending on subsequent wet etch rate adjustment, as further described herein.

Figure 26:
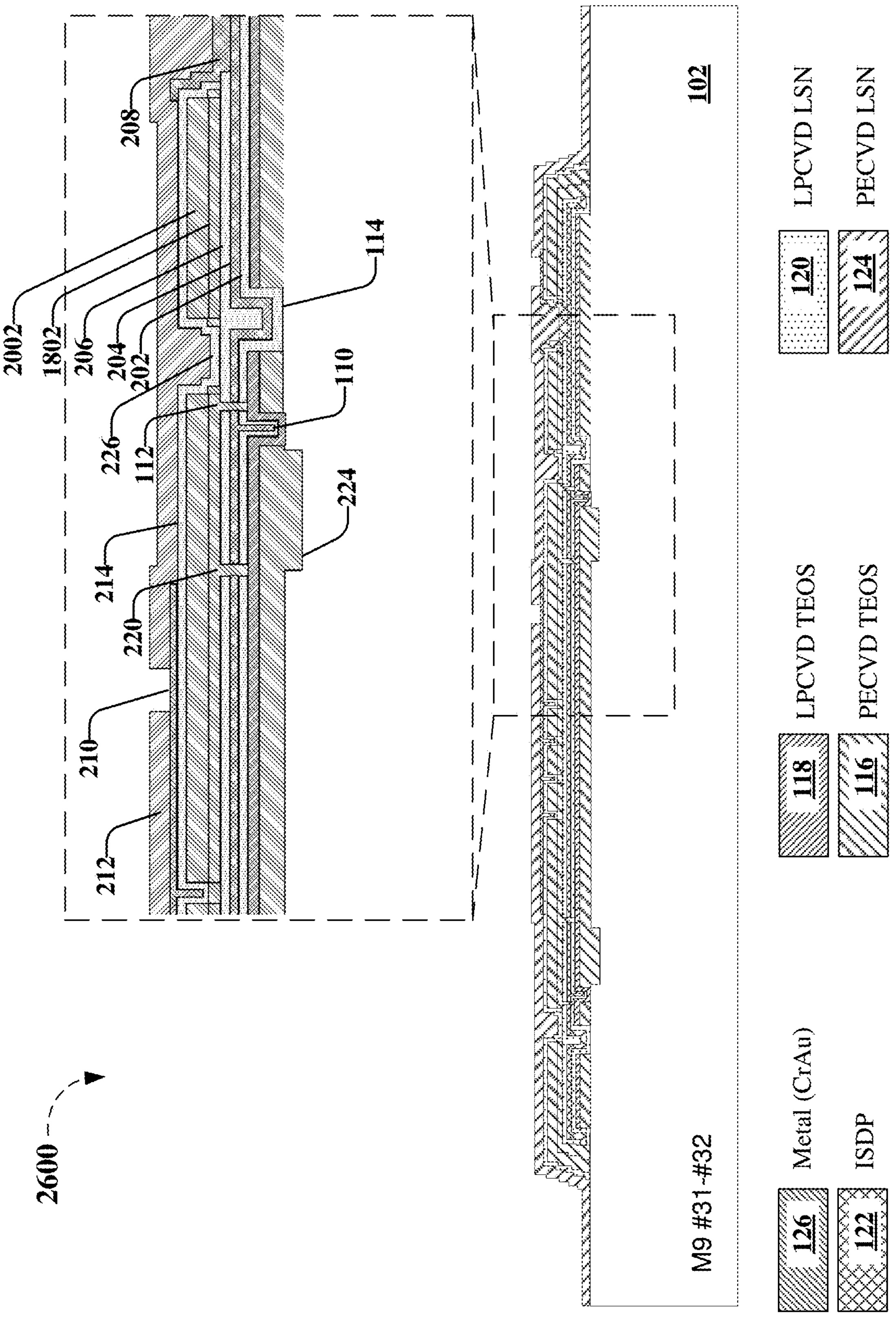

FIG. 26 depicts exemplary fabrication process results 2600, in which the extent and critical dimensions of the features (e.g., metal contact to poly-Si contact 208 coupled to the poly-Si acoustic sensor membrane 104 electrode layer 204 and metal contact 216 coupled to the poly-Si backplate or top plate 106 electrode layer 210, and so on) is lithographically defined (e.g., via mask M9) and etched. The etch of the etched areas can terminate at the poly-Si contact 208 coupled to the poly-Si acoustic sensor membrane 104 electrode layer 204 and the poly-Si backplate or top plate 106 electrode layer 210, respectively.

Figure 27:
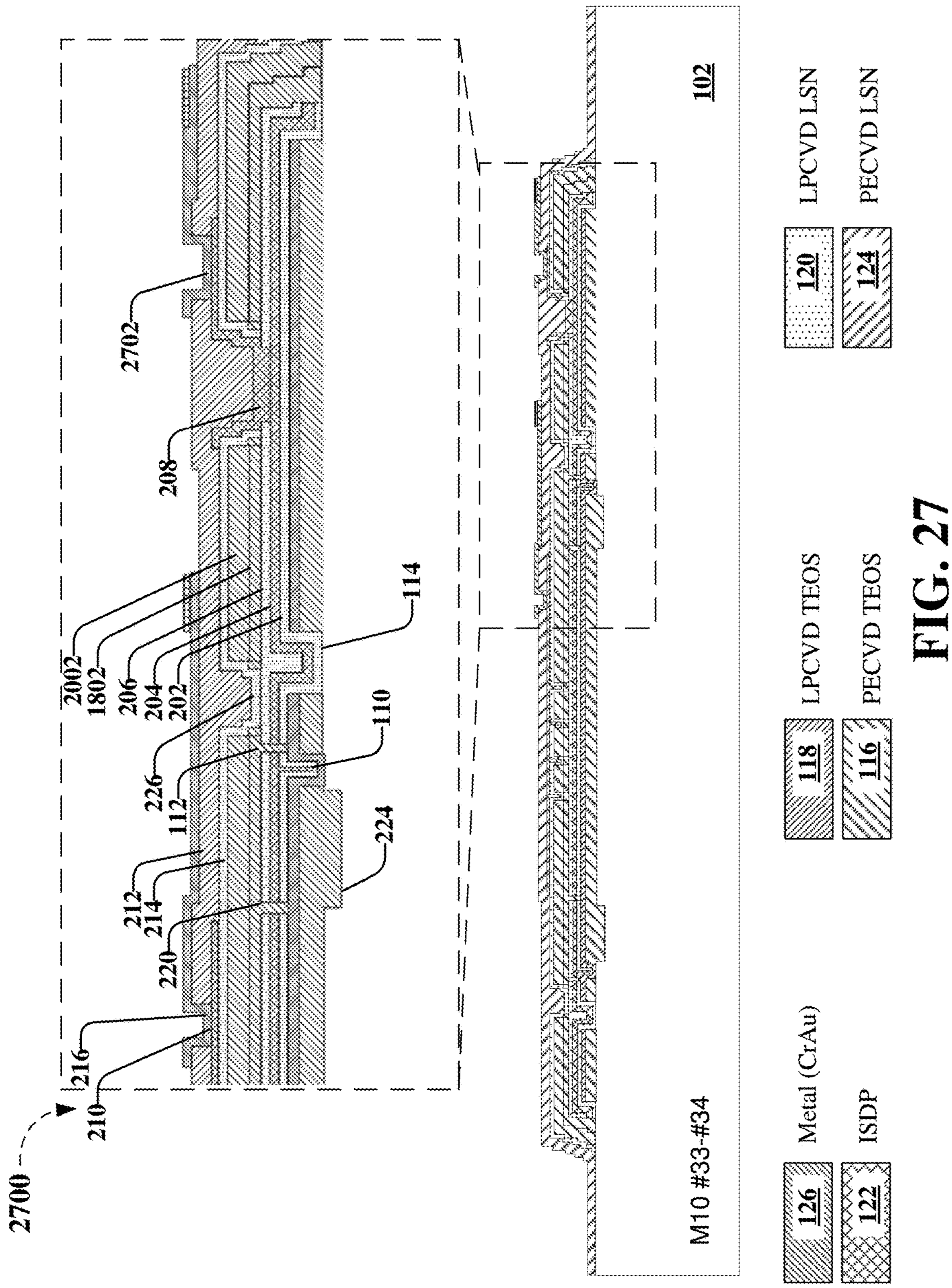

FIG. 27 depicts exemplary fabrication process results 2700, in which the extent and critical dimensions of the features (e.g., metal contact 2702 to poly-Si contact 208 coupled to the poly-Si acoustic sensor membrane 104 electrode layer 204 and metal contact 216 coupled to the poly-Si backplate or top plate 106 electrode layer 210, and so on) is lithographically defined (e.g., via mask M10), metal, e.g., metal (CrAu) 126, is deposited and etched.

Figure 28:
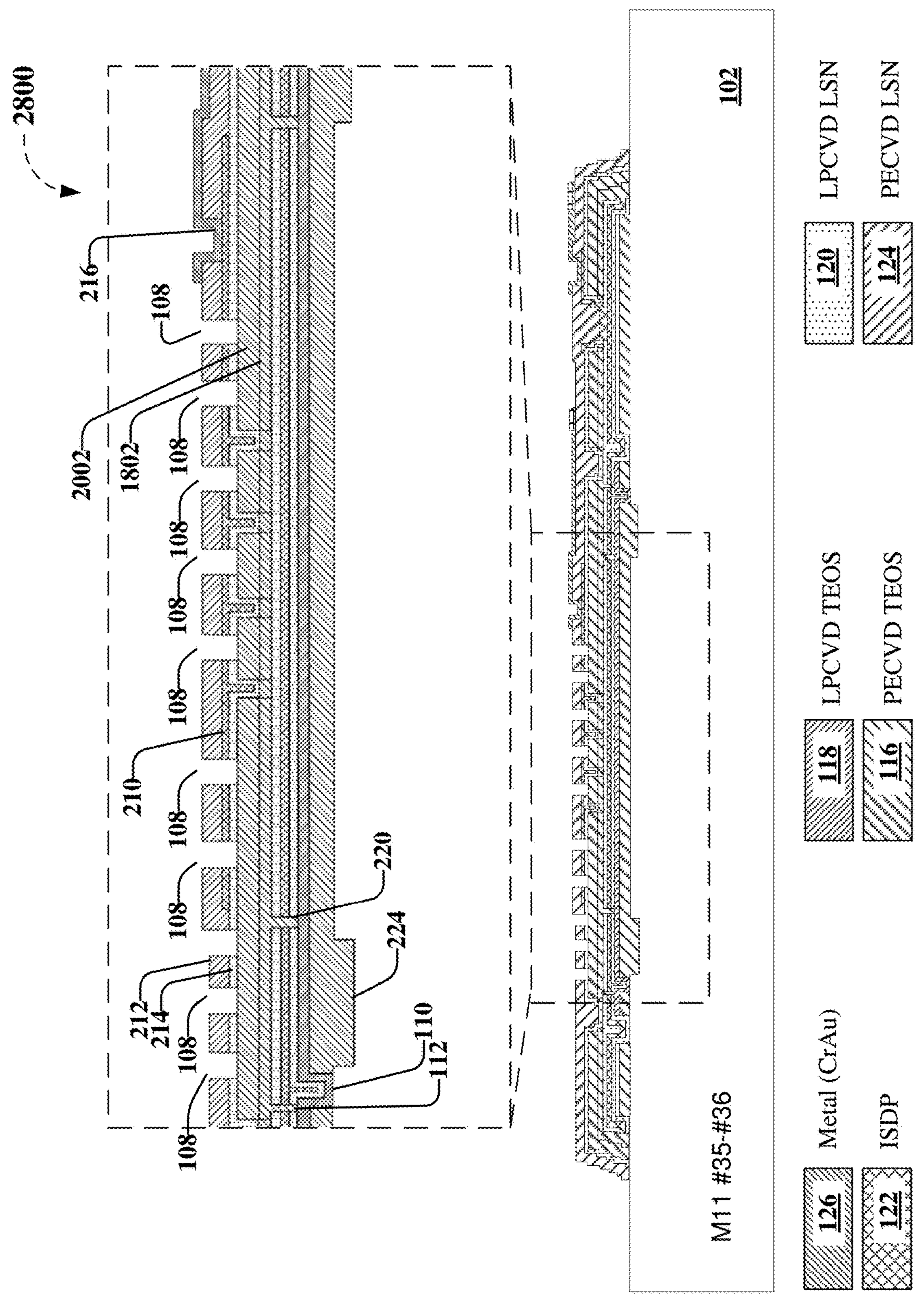

FIG. 28 depicts exemplary fabrication process results 2800, in which the extent and critical dimensions of the features (e.g., backplate or top plate 106 openings 108, and so on) is lithographically defined (e.g., via mask M11) and etched. The etch proceeds through the second SiN backplate or top plate 106 layer 212, e.g., PECVD LSN 124, the poly-Si backplate or top plate 106 electrode layer 210, e.g., ISDP 122, where applicable, and the first SiN backplate or top plate 106 layer 214, e.g., LPCVD LSN 120 to form the backplate or top plate 106 openings 108.

Figure 29:
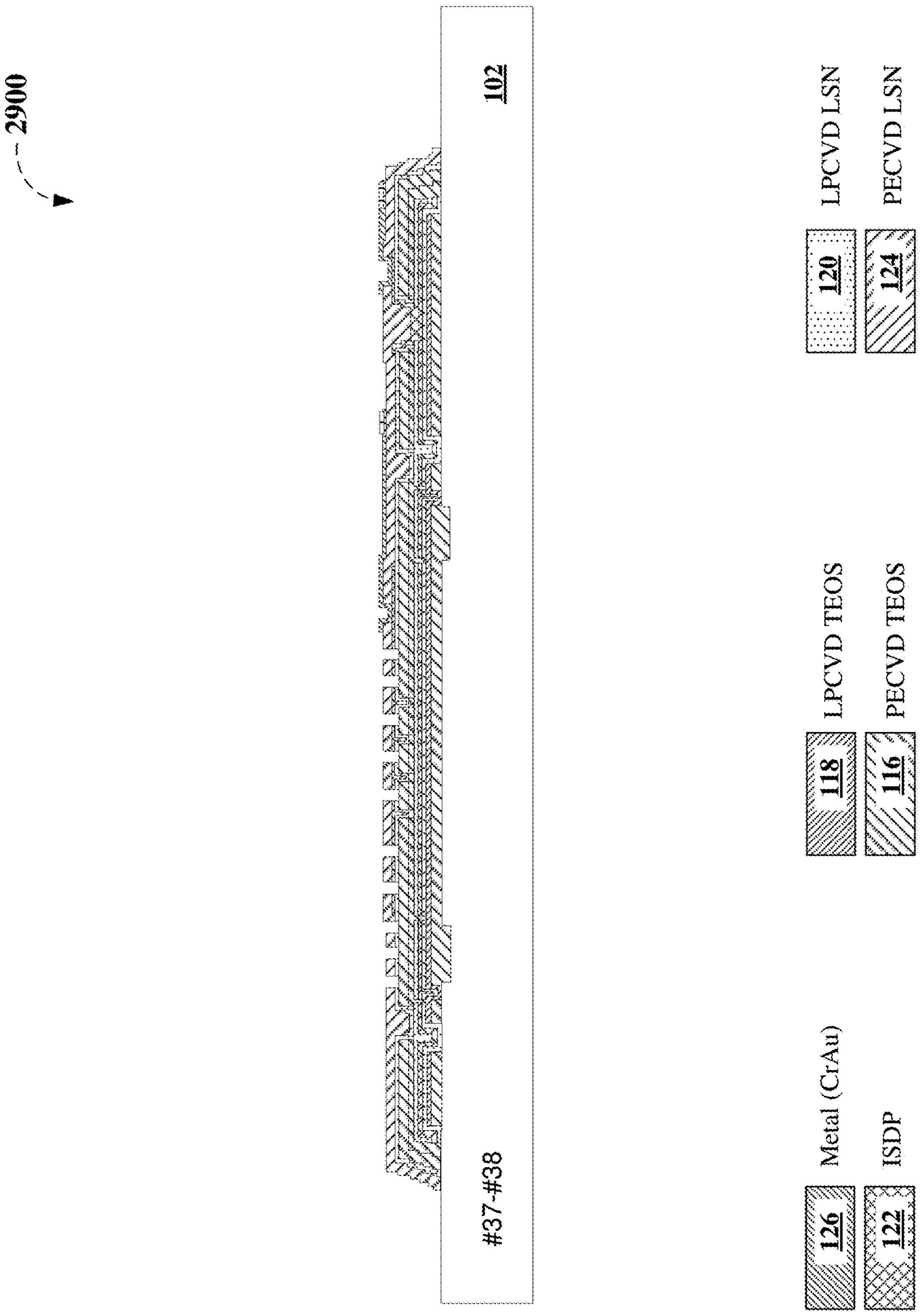

FIG. 29 depicts exemplary fabrication process results 2900, in which the device substrate 102 and device can be protected with a plasma enhanced oxide deposition prior to grinding the device substrate 102 to the appropriate thickness, e.g., approximately 300 microns (μm).

Figure 30:
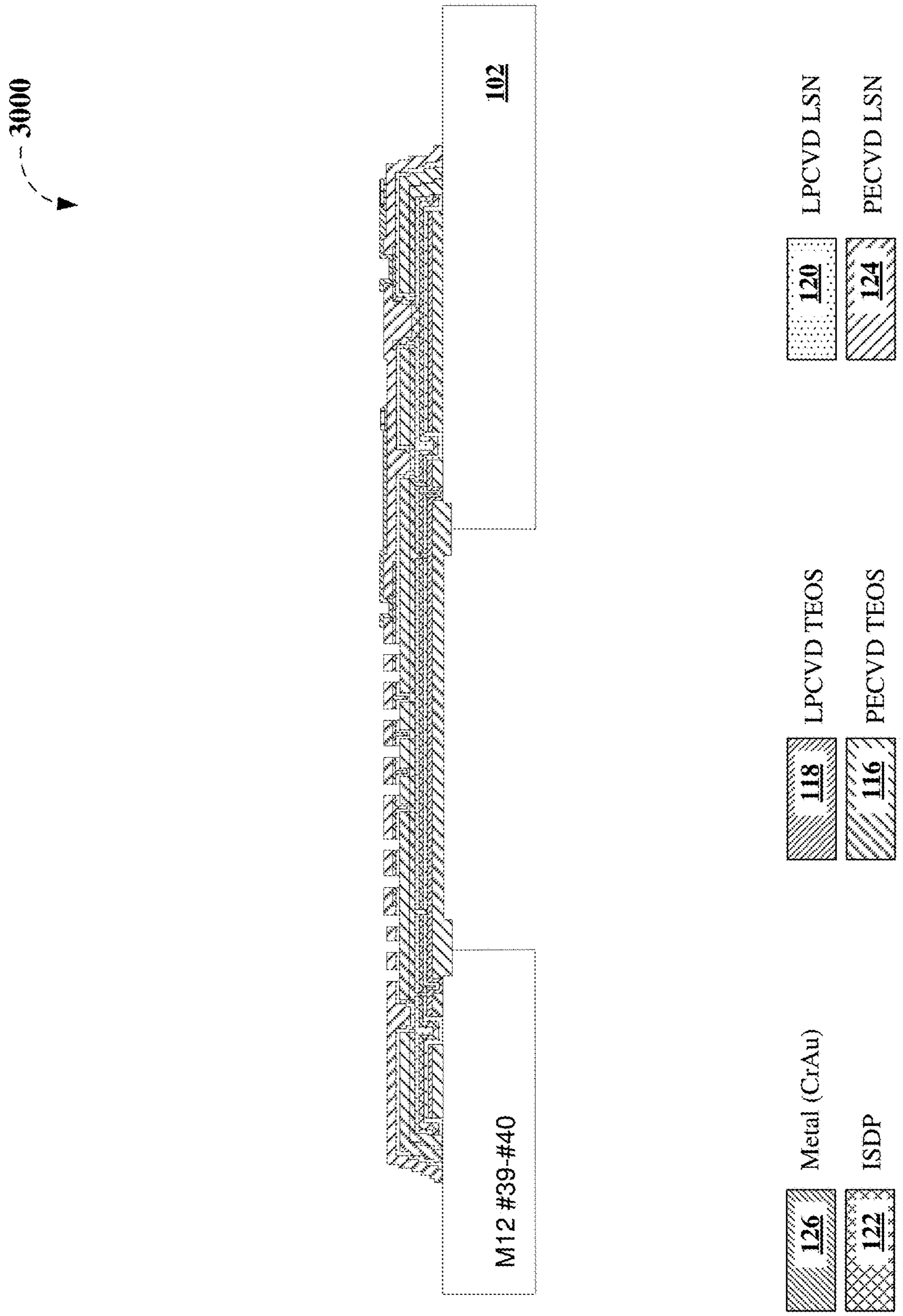

FIG. 30 depicts exemplary fabrication process results 3000, in which the extent and critical dimensions of the features (e.g., cavity 222) is lithographically defined (e.g., via mask M12) and etched. The etch proceeds through device substrate 102 (e.g., the 300 μm device substrate thickness), where it terminates at the bulk oxide deposition, e.g., PECVD TEOS 116, deposited as described above regarding FIG. 10.

Figure 31:
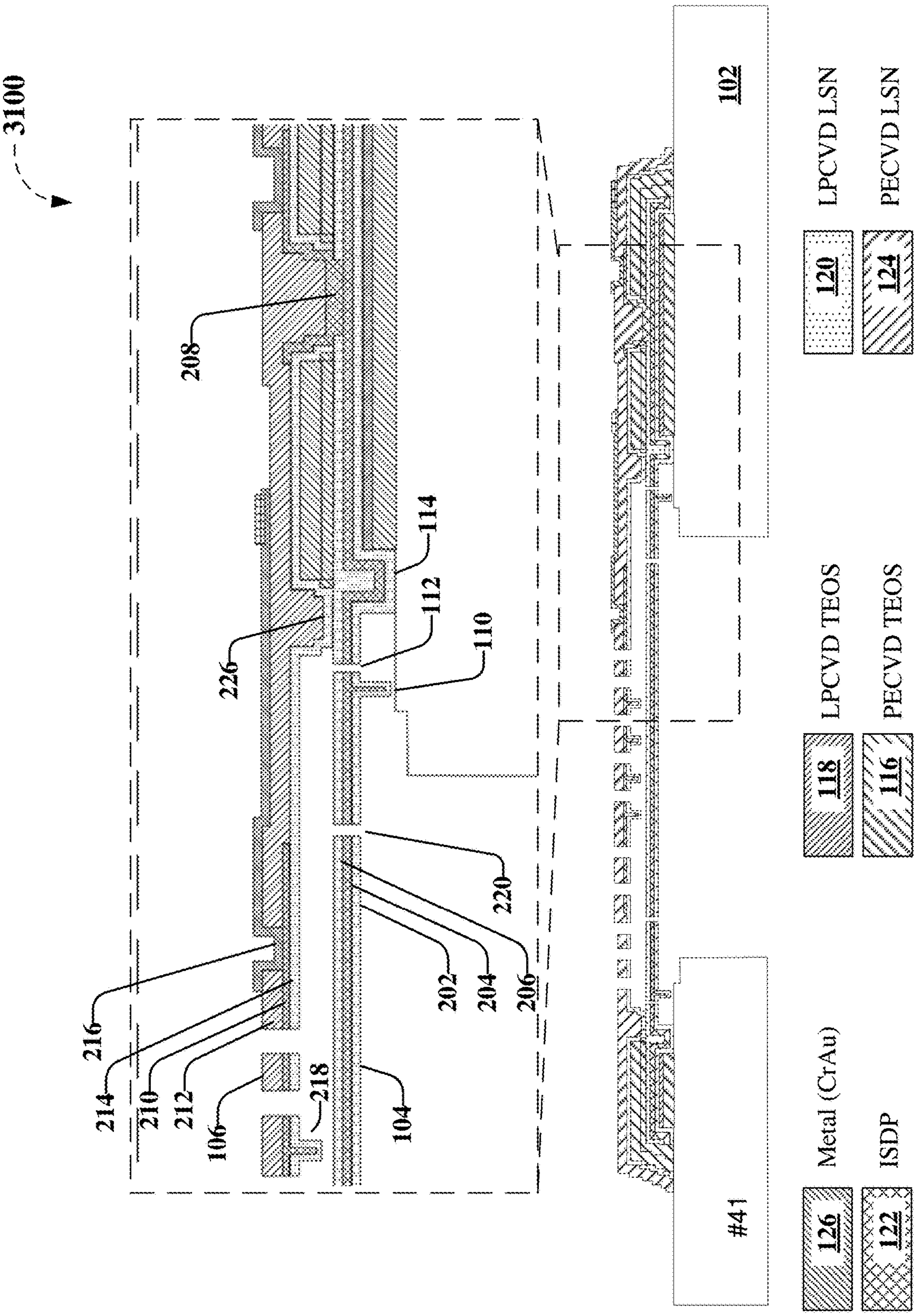

FIG. 31 depicts exemplary fabrication process results 3100, in which the acoustic sensor membrane 104 is released from the acoustic sensor backplate or top plate 106 during an etch release process. In a non-limiting aspect, an exemplary etch release process can comprise a buffered oxide etch (BOE), the speed and/or uniformity with which can be enhanced by the implementation of the disclosed set of etch release structures 112. Thus, FIG. 31 fabrication process results 3100 of an etch release of the defined structure (e.g., the structure fabricated with respect to FIGS. 8-31). The term "release" means that all sacrificial material (e.g., the bulk oxide deposition, e.g., PECVD TEOS 116, deposited as described above regarding FIG. 10, the spacer 1202 oxide, e.g., LPCVD TEOS 118, deposited as described above regarding FIG. 10, a first airgap oxide 1802, e.g., PECVD TEOS 116, deposited as described above regarding FIG. 18, and second airgap oxide 2002, e.g., PECVD TEOS 116, deposited as described above regarding FIG. 20) should be removed, the speed and/or uniformity with which can be enhanced by the implementation of the disclosed set of etch release structures 112.

Accordingly, low-cost, robust, and high performance MEMS acoustic sensors 100 are described herein. In a non-limiting aspect, exemplary MEMS acoustic sensors can comprise a set of etch release structures 112 in the acoustic sensor membrane 104 that facilitates rapid and/or uniform etch release of the acoustic sensor membrane 104. In another non-limiting aspect, exemplary MEMS acoustic sensors 100 can comprise a set of membrane position control structures 114 of the acoustic sensor membrane 104 that can reduce the bending stress of the acoustic sensor membrane. In another non-limiting aspect, MEMS acoustic sensors 100 can comprise a three layer acoustic sensor membrane 104 that provides increased robustness (e.g., higher yield strength), for example, as further described herein. In yet another non-limiting aspect, MEMS acoustic sensors 100 can comprise a multi-layer acoustic sensor backplate or top plate 106 increases robustness for pressure against the backplate by including the first SiN backplate or top plate 106 layer 214 that is adjacent to the poly-Si backplate or top plate 106 electrode layer 210, which can be selectively defined to allow high sensitivity and high active capacitance and low parasitic capacitance of described MEMS acoustic sensors 100.

In still other non-limiting aspects, MEMS acoustic sensors 100 can comprise a front cavity 224 which facilitates preventing the acoustic sensor membrane 104 from contacting the device substrate 102 at a reverse acoustic pressure pulse. In addition, inclusion of a fixed-fixed beam design of a acoustic sensor membrane 104 can provide high acoustic compliance/sensitivity.

Figure 32:
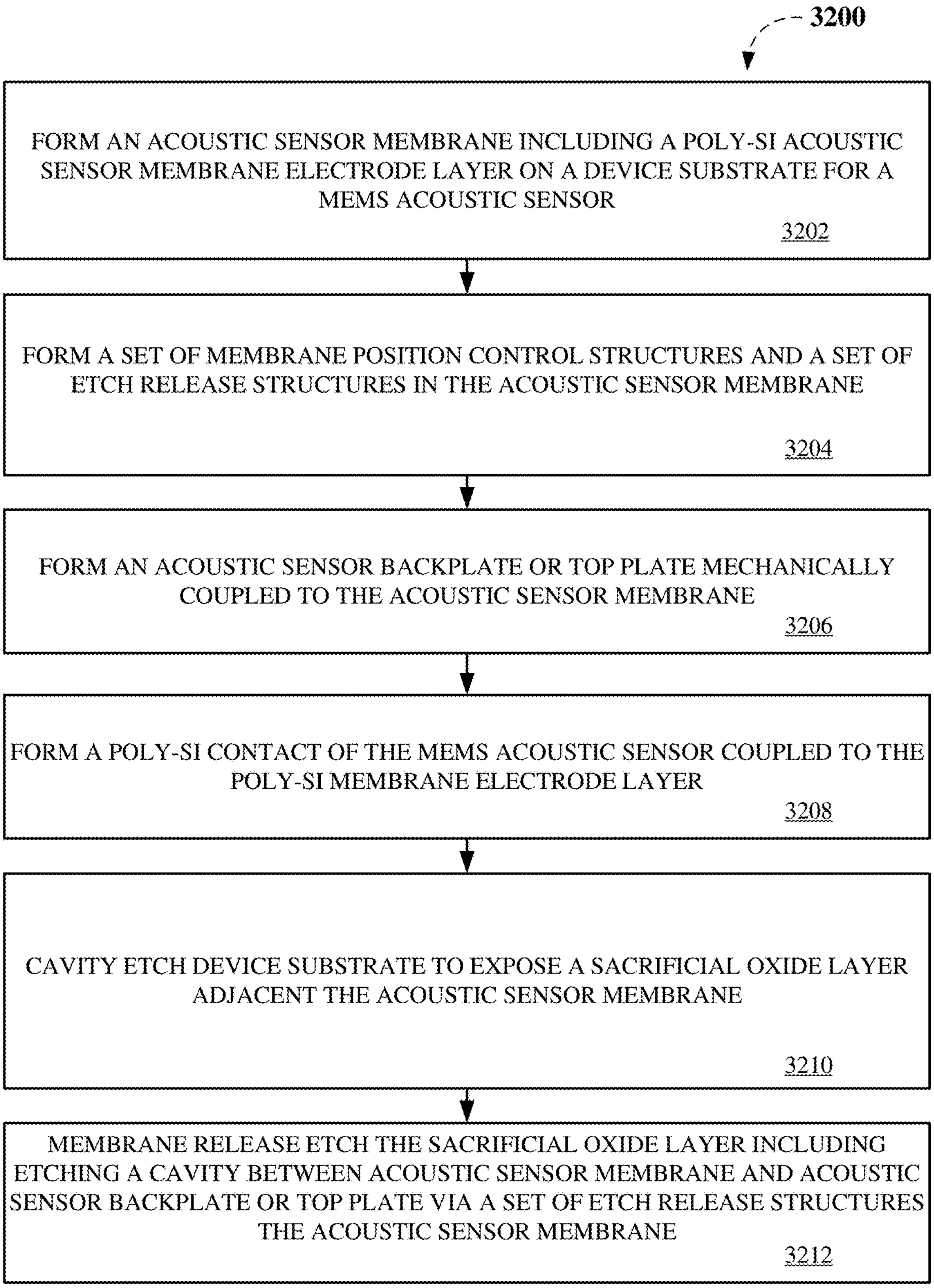
FIG. 32 provides a flow diagram of methods associated with fabrication of exemplary MEMS acoustic sensors according to various non-limiting embodiments described herein.

In view of the subject matter described supra, methods that can be implemented in accordance with the subject disclosure will be better appreciated with reference to the flowcharts of FIG. 32. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 32 provides a non-limiting flow diagram of exemplary methods 3200 according to various non-limiting aspects as described herein. For instance, at 3202, exemplary methods 3200 of fabricating a MEMS acoustic sensor 100 can comprise forming an acoustic sensor membrane 104 (e.g., forming an acoustic sensor membrane 104 comprising a stacked arrangement of a first SiN acoustic sensor membrane 104 layer 202, a poly-Si acoustic sensor membrane 104 electrode layer 204, and a second SiN acoustic sensor membrane 104 layer 206), as further described herein, for example, regarding FIGS. 8-31.

Exemplary methods 3200 can further comprise, at 3204, forming a set of membrane position control structures 114 on the acoustic sensor membrane 104. In a further non-limiting aspect, exemplary methods 3200 can further comprise, at 3204, forming a set of etch release structures 112 in the acoustic sensor membrane 104.

In further non-limiting embodiments, exemplary methods 3200 can comprise, at 3206, forming an acoustic sensor backplate or top plate 106 that is mechanically coupled to the acoustic sensor membrane 104. In a non-limiting aspect, the exemplary acoustic sensor backplate or top plate 106 can comprise a poly-Si backplate or top plate 106 electrode layer 210 adjacent to a second SiN backplate or top plate 106 layer 212 and a first SiN backplate or top plate 106 layer 214 that is adjacent to the poly-Si backplate or top plate 106 electrode layer 210 and second SiN backplate or top plate 106 layer 212.

In still further non-limiting embodiments, exemplary methods 3200 can comprise, at 3208, forming a poly-Si contact 208 of the MEMS acoustic sensor 100 that is coupled to the poly-Si acoustic sensor membrane 104 electrode layer 204.

In other non-limiting embodiments, exemplary methods 3200 can comprise, at 3210, cavity etching a device substrate 102 cavity 222 into a device substrate 102 that is mechanically coupled to an acoustic sensor membrane 104 located above the device substrate 102 to expose a sacrificial oxide layer (e.g., bulk oxide deposition, e.g., PECVD TEOS 116, deposited as described above regarding FIG. 10) adjacent the acoustic sensor membrane 104. For instance, exemplary methods 3200 can comprise, at 3210, cavity etching a device substrate 102 cavity 222 into a device substrate 102 that is mechanically coupled to an exemplary acoustic sensor membrane 104 affixed to the device substrate 102 at a periphery of the acoustic sensor membrane 104, wherein the acoustic sensor membrane 104 comprises a set of membrane position control structures 114 near the periphery and protruding toward the device substrate 102.

In addition, exemplary methods 3200 can comprise, at 3212, membrane release etching the sacrificial oxide layer (e.g., bulk oxide deposition, e.g., PECVD TEOS 116, deposited as described above regarding FIG. 10) adjacent to the acoustic sensor membrane 104. Thus, exemplary methods 3200 can comprise, at 3212, membrane release etching (e.g., etching a first airgap oxide 1802, e.g., PECVD TEOS 116, deposited as described above regarding FIG. 18, and second airgap oxide 2002, e.g., PECVD TEOS 116, deposited as described above regarding FIG. 20) a cavity between the acoustic sensor membrane 104 and an acoustic sensor backplate or top plate 106 that is located opposite the device substrate 102 cavity 222 via one or more vents 220 located in the acoustic sensor membrane 104 and etching an area of the acoustic sensor membrane 104 and the set of membrane position control structures 114 via a set of etch release structures 112 in the acoustic sensor membrane 104 located between the periphery and the set of membrane position control structures 114.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure illustrative purposes, various modifications are possible that are considered within the scope of such embodiments and examples, as those skilled in the relevant art can recognize. For example, while embodiments of the subject disclosure are described herein in the context of MEMS sensors (e.g., such as MEMS acoustic sensors, etc.), it can be appreciated that the subject disclosure is not so limited. For instance, various exemplary implementations may find application in other areas of MEMS sensors, devices, and methods, without departing from the subject matter described herein.

In addition, the words “example” or “exemplary” is used herein to mean serving as an example, instance, or illustration. Any aspect or design described herein as “exemplary” is not necessarily to be construed as preferred or advantageous over other aspects or designs. Rather, use of the word, “exemplary,” is intended to present concepts in a concrete fashion. As used in this application, the term “or” is intended to mean an inclusive “or” rather than an exclusive “or”. That is, unless specified otherwise, or clear from context, “X employs A or B” is intended to mean any of the natural inclusive permutations. That is, if X employs A; X employs B; or X employs both A and B, then “X employs A or B” is satisfied under any of the foregoing instances. In addition, the articles “a” and “an” as used in this application and the appended claims should generally be construed to mean “one or more” unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms “includes,” “including,” “has,” “contains,” variants thereof, and other similar words are used in either the detailed description or the claims, these terms are intended to be inclusive in a manner similar to the term “comprising” as an open transition word without precluding any additional or other elements.

What is claimed is:

1. A microelectromechanical systems (MEMS) acoustic sensor, comprising:

an acoustic sensor membrane suspended above and mechanically coupled to a substrate at a periphery of the acoustic sensor membrane, wherein the acoustic sensor membrane is configured to be deformed by acoustic pressure;

an acoustic sensor backplate mechanically coupled to the acoustic sensor membrane and comprising openings that permit passage of the acoustic pressure, wherein the acoustic sensor backplate comprises a polycrystalline silicon (poly-Si) backplate electrode layer adjacent to a first silicon nitride (SiN) backplate layer and a second SiN backplate layer that is adjacent to the poly-Si backplate electrode layer and opposite the first SiN backplate layer;

a plurality of membrane position control structures of the acoustic sensor membrane near the periphery that extend perpendicular relative to a surface of the acoustic sensor membrane opposite the acoustic sensor backplate; and a plurality of etch release structures in the acoustic sensor membrane located between the periphery and the plurality of membrane position control structures.

2. The MEMS acoustic sensor of claim 1, further comprising:

a lateral etch stop structure disposed on the acoustic sensor membrane at the periphery, located where the acoustic sensor membrane is mechanically coupled to the substrate.

3. The MEMS acoustic sensor of claim 2, wherein the plurality of etch release structures is configured to enable a uniform wet etch in an area of the acoustic sensor membrane, the lateral etch stop structure, and the plurality of membrane position control structures during a membrane etch release fabrication process.

4. The MEMS acoustic sensor of claim 3, wherein the plurality of etch release structures in the acoustic sensor membrane comprises a set of passages through the acoustic sensor membrane that are configured to allow the wet etch into the area.

5. The MEMS acoustic sensor of claim 4, wherein the set of passages through the acoustic sensor membrane is configured to reduce etch time required to equalize an etch in the area.

6. The MEMS acoustic sensor of claim 2, wherein the plurality of membrane position control structures is configured limit movement of the acoustic sensor membrane in a direction away from the acoustic sensor backplate or reduce bending stress on the acoustic sensor membrane at a junction of the acoustic sensor membrane and the lateral etch stop structure.

7. The MEMS acoustic sensor of claim 1, wherein the plurality of membrane position control structures comprise a plurality of separate membrane position control structures, each protruding perpendicular relative to a surface of the acoustic sensor membrane, opposite the acoustic sensor backplate, and toward the substrate.

8. The MEMS acoustic sensor of claim 1, wherein the acoustic sensor membrane comprises a stacked arrangement of a first SiN membrane layer, a poly-Si membrane electrode layer, and a second SiN membrane layer.

9. The MEMS acoustic sensor of claim 8, further comprising:

a poly-Si contact coupled to the poly-Si membrane electrode layer.

10. The MEMS acoustic sensor of claim 1, further comprising:

a metal contact coupled to the poly-Si backplate electrode layer.

11. The MEMS acoustic sensor of claim 1, wherein the acoustic sensor backplate is configured with at least one backplate stop comprised of at least the first SiN backplate layer and adapted to limit contact of the acoustic sensor membrane with the acoustic sensor backplate.

12. The MEMS acoustic sensor of claim 1, further comprising:

a second lateral etch stop structure disposed on the acoustic sensor backplate, located where the acoustic sensor backplate is mechanically coupled to the acoustic sensor membrane.

13. The MEMS acoustic sensor of claim 1, further comprising:

an acoustic port formed in the substrate that is configured to direct the acoustic pressure to the acoustic sensor membrane to deflect the acoustic sensor membrane toward the acoustic sensor backplate; and a front cavity formed in the port, proximate to the acoustic sensor membrane, and configured to prevent contact of the acoustic sensor membrane with the substrate.

14. The MEMS acoustic sensor of claim 1, wherein the acoustic sensor membrane further comprises at least one vent formed into the acoustic sensor membrane, wherein a portion of the at least one vent is a curved opening in the acoustic sensor membrane, and wherein the at least one vent is disposed substantially along a side of the acoustic sensor membrane.

15. The MEMS acoustic sensor of claim 1, wherein the plurality of membrane position control structures is arranged in at least one of a singular sequence of membrane position control structures near the periphery of the acoustic sensor membrane or multiple sequences of membrane position control structures near the periphery of the acoustic sensor membrane.

16. A method of fabricating a microelectromechanical System (MEMS) acoustic sensor, comprising:

forming an acoustic sensor backplate of the MEMS sensor that is mechanically coupled to an acoustic sensor membrane, wherein the acoustic sensor backplate comprises a polycrystalline silicon (poly-Si) backplate electrode layer adjacent to a first silicon nitride (SiN) backplate layer and a second SiN backplate layer that is adjacent to the poly-Si backplate electrode layer and opposite the first SiN backplate layer;

cavity etching a substrate cavity into a substrate that is mechanically coupled to the acoustic sensor membrane located above the substrate to expose a sacrificial oxide layer adjacent the acoustic sensor membrane, wherein the acoustic sensor membrane is affixed to the substrate at a periphery of the acoustic sensor membrane, and wherein the acoustic sensor membrane comprises a plurality of membrane position control structures near the periphery and protruding toward the substrate; and membrane release etching the sacrificial oxide layer adjacent to the acoustic sensor membrane including etching a cavity between the acoustic sensor membrane and the acoustic sensor backplate that is located opposite the substrate cavity via at least one vent located in the acoustic sensor membrane and etching an area of the acoustic sensor membrane and the plurality of membrane position control structures via a plurality of etch release structures in the acoustic sensor membrane located between the periphery and the plurality of membrane position control structures.

17. The method of claim 16, further comprising:

forming the acoustic sensor membrane comprising a stacked arrangement of a first SiN membrane layer, a poly-Si membrane electrode layer, and a second SiN membrane layer.

18. The method of claim 17, wherein the forming the acoustic sensor membrane includes forming the plurality of membrane position control structures on the acoustic sensor membrane and forming the plurality of etch release structures.

19. The method of claim 17, further comprising:

forming a poly-Si contact of the MEMS acoustic sensor that is coupled to the poly-Si membrane electrode layer.

* * * * *